(12) United States Patent
Jordan

(10) Patent No.: US 6,950,050 B1
(45) Date of Patent: Sep. 27, 2005

(54) METHOD AND APPARATUS FOR INCREASING EFFECTIVE RESOLUTION OF ANALOG OUTPUT OF DIGITAL-TO-ANALOG CONVERTER (DAC) HAVING PREDETERMINED DIGITAL WORD SIZE, WHERE DAC DRIVES PLANT

(75) Inventor: Scott C. Jordan, San Jose, CA (US)

(73) Assignee: PI (Physik Instrumente) L.P., Auburn, MA (US)

( * ) Notice: Subject to any disclaimer, the term of this patent is extended or adjusted under 35 U.S.C. 154(b) by 0 days.

(21) Appl. No.: 11/101,766

(22) Filed: Apr. 8, 2005

(51) Int. Cl.[7] ............................................. H03M 1/66
(52) U.S. Cl. ....................................... 341/144; 341/131
(58) Field of Search ................................ 341/144, 143, 341/121, 131

(56) References Cited

U.S. PATENT DOCUMENTS

| | | | |
|---|---|---|---|
| 5,805,095 A | * | 9/1998 | Humphreys et al. ......... 341/144 |
| 5,936,564 A | * | 8/1999 | Jun .............................. 341/144 |
| 6,016,113 A | * | 1/2000 | Binder ......................... 341/131 |
| 6,052,076 A | * | 4/2000 | Patton, III et al. ........... 341/144 |
| 6,281,822 B1 | * | 8/2001 | Park ............................ 341/144 |
| 6,727,832 B1 | * | 4/2004 | Melanson ..................... 341/143 |

* cited by examiner

Primary Examiner—Michael Tokar
Assistant Examiner—Linh V. Nguyen
(74) Attorney, Agent, or Firm—MacPherson Kwok Chen & Heid LLP; Gideon Gimlan

(57) ABSTRACT

In one embodiment, one or more less significant input bits (LSB's) of a digital-to-analog converter (DAC) are pulsed or otherwise modulated at a frequency substantially higher than the response cutoff frequency of a driven analog plant (e.g., a finely positioned mechanical table). The band pass characteristics of the driven analog plant convert the high frequency energy content of the pulses applied to the DAC's input into a smoothed response having a substantially lower frequency (e.g., an essentially DC response). By varying the duty cycle of the high frequency pulses, the system can be controlled to make it appear as if the DAC has a greater number of input bit nodes than it actually has. The analog plant can then be driven with finer resolution than that provided by the limited number of input bit nodes of the DAC.

33 Claims, 6 Drawing Sheets

100

600

METHOD AND APPARATUS FOR INCREASING EFFECTIVE RESOLUTION OF ANALOG OUTPUT OF DIGITAL-TO-ANALOG CONVERTER (DAC) HAVING PREDETERMINED DIGITAL WORD SIZE, WHERE DAC DRIVES PLANT

FIELD OF DISCLOSURE

The present invention relates generally to the conversion of digital representations of parameter magnitude into analog representations and analog response. The disclosure relates more specifically to the use of Digital-to-Analog Converters (DAC) in complex control environments.

DESCRIPTION OF RELATED ART

Digital-to-Analog Converters (DAC's) are widely used in industry for converting digital representations of parameter magnitude into analog representations and/or analog response. Examples of DAC use include those of digitally-commanded waveform generators that produce analog waveforms, programmable voltage or current sources, digitally-controlled servo systems that include analog components (i.e. digitally-commanded positioning systems and machine control systems), and digitally-controlled measurement systems where the DACs drive analog measurement devices to one extent or another. The art of DAC usage has advanced to the point where it is common for users to purchase mass produced and user-programmable DAC-cards (e.g., printed circuit boards or laptop insertable slot units) sporting a number of DAC's on each card or even USB-style DAC modules that can be plugged on a plug-and-play basis into the USB connector of a portable computer. Half a dozen DAC's may be easily contained, for example, within an industry-standard PCMCIA card that removably slides into a laptop or other computer slot. Bigger cards of standardized configuration may be embedded in industrial equipment, and these may have a larger number of more sophisticated DAC's soldered into them. Additionally, in some instances, customized or one-of-a-kind printed circuit boards or other customized modules may be custom designed and produced for specific instrumentation or equipment needs where the customized modules include one or more DAC's of fixed design.

Each of the one or more DAC's on a given, standardized or customized card will typically have a maximum number of input bits that it can convert at one time into an analog counterpart, say 12 or 16 bits per DAC. Conventionally, this maximum number of convertible input bits defines the per-step resolution of the analog output signal produced by the DAC. A 16-bit DAC, for example, will generally produce $2^{16}$ output levels. If the output function has identically-sized steps, each step will represent a $1/(2^{16})$ fraction of the overall output sweep. If the user wants to achieve a higher resolution, the user will be forced (under conventional approaches) to find a DAC with a greater effective number of input bits, or to use two or more DAC's and an analog output adder that adds the outputs of the plural DAC's, where one DAC outputs steps of much finer resolution than the steps of the other.

In the standardized or customized situation, each of the one or more DAC's may also have a variety of user-controllable settings such as minimum and/or maximum output voltage, minimum and/or maximum output current, user-programmable gain and/or offset, user-programmable slew rate, and so forth. Specific user-controllable settings may vary from one manufacturer's brand and product model family to the next. By way of example, a user may elect to programmably set the analog output range of a given DAC to the voltage range: −10V to +10V, or alternatively to the narrower voltage range: 0V to +10V, although sometimes the range may be fixed by the DAC manufacturer. In practice, the user's software or firmware defines an analog voltage output range for the given DAC by writing a digital command to a command-receiving input of the DAC, either as a single update or, in the case of waveform envelope generation, as a rapidly-clocked series of update commands. The digital input of each DAC typically has a characteristic number of bits which can be written to effect a conversion. The more common, commercially-available DACs have 8, 12 or 16 bits as their characteristic number of input bits. In rarer cases, one might encounter 18, 20 or 24 bit DACs. The number of characteristic input bits, N, defines the resolution of the DAC, since its analog output can be divided into $2^N$ steps, which are most commonly arranged in a linear fashion where each step is the same size. Thus a typical 12 bit DAC with an analog output range of 0–10V can produce up to 4,096 possible output voltages, each representing an increment of $(10V/4,096)=2.4$ mV.

In addition to being each user-programmable, the plural DACs of a multi-DAC's card will typically be coupled to a user-programmable, interface section of the card for interfacing with a host computer bus. User-controllable settings at the host-card level may include the setting of update rates for different analog channels and the setting of interrupt alert events. Once again, specific user-controllable settings for the host-to-card interface may vary from one manufacturer's card to the next and different types of parallel or serial interface protocols may be adopted.

End-users often develop complex control systems over time for controlling analog functionalities with digital control sources (e.g., with computers or computer networks). Their systems tend to become inexorably intertwined with the specific nuances of a particular brand and/or family and/or model of DAC card such that it becomes extremely undesirable, as well as impractical, to switch to the use of a different DAC card. The reason(s) for why a user may feel married to a particular DAC or family of DAC's can vary. Some users may prefer a particular family of DAC's and/or DAC cards because their accuracy, reliability, stability and/or robustness have been proven by prolonged, in-the-field testing. Some applications may place the DAC's in uniquely challenging environments where the packaging and/or internal electronics of the DAC may have to face wide temperature swings, exposure to harsh chemicals, exposure to severe vibrations, widely fluctuating power supply voltages, and/or other challenges and where the accuracy and/or ruggedness and/or fail-safe performance of the DAC is mission critical. Some users may have developed complex software algorithms whose operation relies on the unique nuances of a specific family of DAC's and/or software provided by the DAC vendor (or by a third party) and/or on the behavior of analog platforms controlled by those DAC's. More specifically, one well known commercial vendor of DAC's, National Instruments of Austin, Tex. provides a Lab-VIEW™ software suite which is rich with prefabricated A/D and D/A subroutines that allow end-users to create complex test and measurement functionalities fairly quickly. End-users who use LabVIEW™ are therefore essentially forced to use National Instrument's highly-popular DAC's. In view of this, if a need arises to improve the output resolution of just one or a few DAC's among a large array of similar DAC's, where the improvement might be from say a 16-bit characteristic resolution to 17-bit characteristic resolution, users will ordinarily forgo the change because it means (heretofore), the upsetting of the whole apple cart, so to speak, just to upgrade one or a few items.

Aside from the problem of standardized and/or inexorably embedded DAC cards, USB-style DAC modules and other such DAC devices, a given DAC circuit may be inseparable from a given system in which it is embedded for other reasons. One example is shielded systems. A digital drive signal is often more immune to noise and degradation than is its counterpart analog drive signal. Accordingly, in some systems, an application-specific shielding box is constructed about the DAC circuit and subsequent analog circuitry so as to shield at least the analog portion of the electronics from ambient noise. It is often impractical to open the shielding box and replace a pre-installed and in-box DAC circuit with a new one of higher resolution. Additionally, so-called sensor/actuator modules are widely used in industry where custom calibration data is locally stored inside a module housing for use by a combination of specific sensor and/or actuator and a DAC and ADC (analog-to-digital converter) pair that has been married to that specific sensor and/or actuator. The locally-stored calibration data is created for just that unique combination of sensor/actuator and ADC/DAC pairing. It is neither physically practical nor desirable to remove the DAC from the module nor is it logically practical or worthwhile to do so because the work of creating the customized calibration data will be lost if a new, upgraded, DAC/ADC pair is to be installed into the module in place of the already-present DAC/ADC pair. Nonetheless, situations arise where it may be desirable to increase the resolution of a given DAC. Heretofore, users would forgo such a change because it would mean upsetting of the whole apple cart, and the cost of doing so was just not worth the benefits to be gained from upgrading the resolution of the DAC.

SUMMARY

Structures and methods are provided in accordance with the present disclosure of invention for overcoming the above-summarized shortcomings of the prior art.

It has been observed that many types of DAC-driven, analog plants (e.g., analog positioning systems) exhibit frequency responses that include a substantial cut-off of input-following response above a determinable upper frequency ($f_{cutoff}$) and/or a substantial drop in input-following response at a determinable, anti-pole frequency ($f_{zero}$). It has been observed that many of these analog plants also exhibit an integration behavior wherein the energy of narrowly-pulsed and substantially, uni-directed excitations (i.e., either mostly positive in magnitude or mostly negative in magnitude) is transformed via an over-time integration process to thereby produce a corresponding, lower-frequency or DC response of substantially lower magnitude when the frequency content of the excitational input pulses is centered above the cutoff frequency ($f_{cutoff}$) of the plant, or if the frequency content is centered near the anti-pole frequency ($f_{zero}$) of the plant. A simple example is that of a piezoelectric actuator coupled to a damped spring-mass mechanism where the piezoelectric actuator is used for converting a supplied input voltage signal (typically a high voltage input) into a fine positioning of a portion (a positioned body portion) of the spring-mass mechanism. If the applied, analog input voltage signal contains a series of positive and narrow pulses repeated at a very high frequency and riding on top of an essentially DC, drive level, the finely positioned body will not move in a waveshape-conforming and immediate response to each of the narrow pulses (or other forms of high frequency, and predominantly unipolar excitation). Instead, the positioned mass will respond in a rather sluggish (lethargic) manner, moving slowly and only slightly relative to the high frequency and predominantly unipolar drive-impulses applied to the actuator. The mass and/or other integrating aspects of the pulsed system will time-integrate the effects of the high frequency, narrow pulses (or other forms of predominantly uni-polar high frequency energy) applied to it and will change state accordingly, with sluggish inertia and at a lower response frequency or according to an equivalent DC response.

The invention takes advantage of this property and is not limited to piezoelectrically actuated positioning systems. Many mechanical systems have inherent spring, mass and damping characteristics due to the materials used to build them. Thus, special modifications do not have to be introduced in order to cause a driven mechanical plant to exhibit sluggish response above its natural cutoff frequency and/or at its anti-pole frequencies. More specifically, the aluminum alloys and/or steel and/or titanium alloys and/or other materials (including ceramics and granite) that are often used to build high precision mechanical movement stages have inherent mass as well as inherent spring constants and damping coefficients. Thus the mechanisms which cause a driven plant to behave sluggishly in response to certain frequencies and/or phases of drive signal do not have to be discrete or explicit. They can be integrally implicit within the driven plant.

In one embodiment of the invention, one or more of the least significant bits (LSB's) of a DAC input port is/are pulse width modulated (or otherwise modulated) and the switching of the one or more pulsed LSB's is performed at a sufficiently high rate such that their effect on a driven plant is substantially smoothed out by the plant's sluggishness. The effective analog output result of the excited plant then corresponds to a DAC (digital-to-analog converter) having more input bits (a greater resolution) than the characteristic number of input bits physically associated with the DAC that is actually used. This apparent increase in the number of input bits to which the plant-driving DAC seems to be responding to, will be referred to herein at times as adding pseudo-bits, or virtual bits to the physical DAC.

More broadly speaking, in accordance with the invention, one or more input bits of a DAC are specially modulated (e.g., specially pulsed) at a rate above a corresponding high end cutoff of a DAC-driven driven plant (and/or at a rate corresponding to a response-trough or anti-pole frequency of the driven plant or another sluggish operational aspect of the plant) and the effective duty cycle of specially modulated one or more input bits is varied so that the driven plant responds sluggishly to the special modulation (e.g., special pulsing) by exhibiting a response level positioned in between discrete response steps associated with the characteristic number of bits of the DAC input port. Stated otherwise, the amount of unipolar energy that is injected into the driven plant at a rate above the cutoff frequency of the driven plant (or at a rate corresponding to an anti-pole) is intentionally varied so as to thereby vary the corresponding low frequency or DC response of the plant to the added or subtracted unipolar energy that is pulsatile-wise applied above-cutoff and/or at an anti-pole of the plant's frequency response curve. (As used herein, unipolar is understood to encompass predominantly unipolar or substantially unipolar over an effective time span rather than just entirely unipolar. Thus a predominantly unipolar excitation can include some bipolar excitation within it as long as the overall effect in the relevant time span is such that a significant amount of unipolar excitation has been provided.)

A system in accordance with one embodiment of the disclosure comprises: (a) a digital-to-analog converter (DAC) having a first conventionally-effective number, N of input bits, and having an analog output node that produces an analog output signal having $2^N$ steady-state discrete levels corresponding to binary states of the first effective number, N of input bits; (b) input modulation means (i.e., input pulsing means) for specially modulating one or more of the DAC input bits with corresponding high switching rate modulation signals, where each modulation signal has modulation energy of a substantially higher frequency content than that of normal switching signals, if any, applied as others of the input bits of the DAC (applied at switching rates substantially below the cutoff rate of the driven plant), where the respective duty cycles of the high switching rate modulation signals are variable; and (c) a driven plant coupled to the DAC analog output node and having a sluggish response above a predetermined cutoff frequency of the plant, which sluggish response effectively smoothes the substantially higher frequency content of the DAC analog output signal resulting from use of the one or more high switching rate modulation signals so that the variable duty cycles of the modulation signals operate as fine resolution modifiers for increasing an apparent and steady state, output resolution of the DAC above the characteristic output resolution associated with the DAC's conventionally-effective number, N of input bits. Alternatively or additionally, a special-modulating signal may be injected into an analog outputting, backend of the DAC rather than into the digitally driven front-end of the DAC in order to take advantage of the driven plant's sluggish behavior at certain frequencies and/or phase ranges and to thereby controllably drive the plant to a finer-resolution, steady state between the major discrete, steady states associated with the characteristic number, N of input bits utilized by the DAC. Alternatively or additionally, the amount of high frequency noise or other high frequency energy applied unipolar-wise to the driven plant may be changed over time by use of variable filtering means so as to thereby intentionally alter the lower frequency, sluggish response of the driven plant to that high frequency energy.

A method in accordance with the disclosure comprises: (a) providing a digital-to-analog converter (DAC) having a plural number of input bits, an analog output node that produces an analog output signal corresponding to steady state binary settings of the DAC input bits, and a basic output resolution corresponding to the plural number of DAC input bits; (b) specially-modulating at least one of the DAC input bits with a high rate modulating input signal having modulations of a substantially higher frequency content than normal switching signals, if any, applied to a majority of the other digital input bits of the DAC, where the effective duty cycle of the high frequency specially-modulating input signal is variable; and (c) varying said duty cycle so that a driven plant coupled to the DAC analog output node and having a sluggish behavior at high frequencies, operates to smooth the substantially higher frequency content of the DAC analog output signal resulting from the high frequency, specially-modulated input signal so that the variable duty cycle of the high frequency specially-modulating input signal functions as a fine resolution modifier for increasing an apparent and steady-state output resolution of the DAC above the basic output resolution.

Other aspects of the disclosure will become apparent from the below detailed description.

BRIEF DESCRIPTION OF THE DRAWINGS

The below detailed description section makes reference to the accompanying drawings, in which.

DETAILED DESCRIPTION

Figure 1:
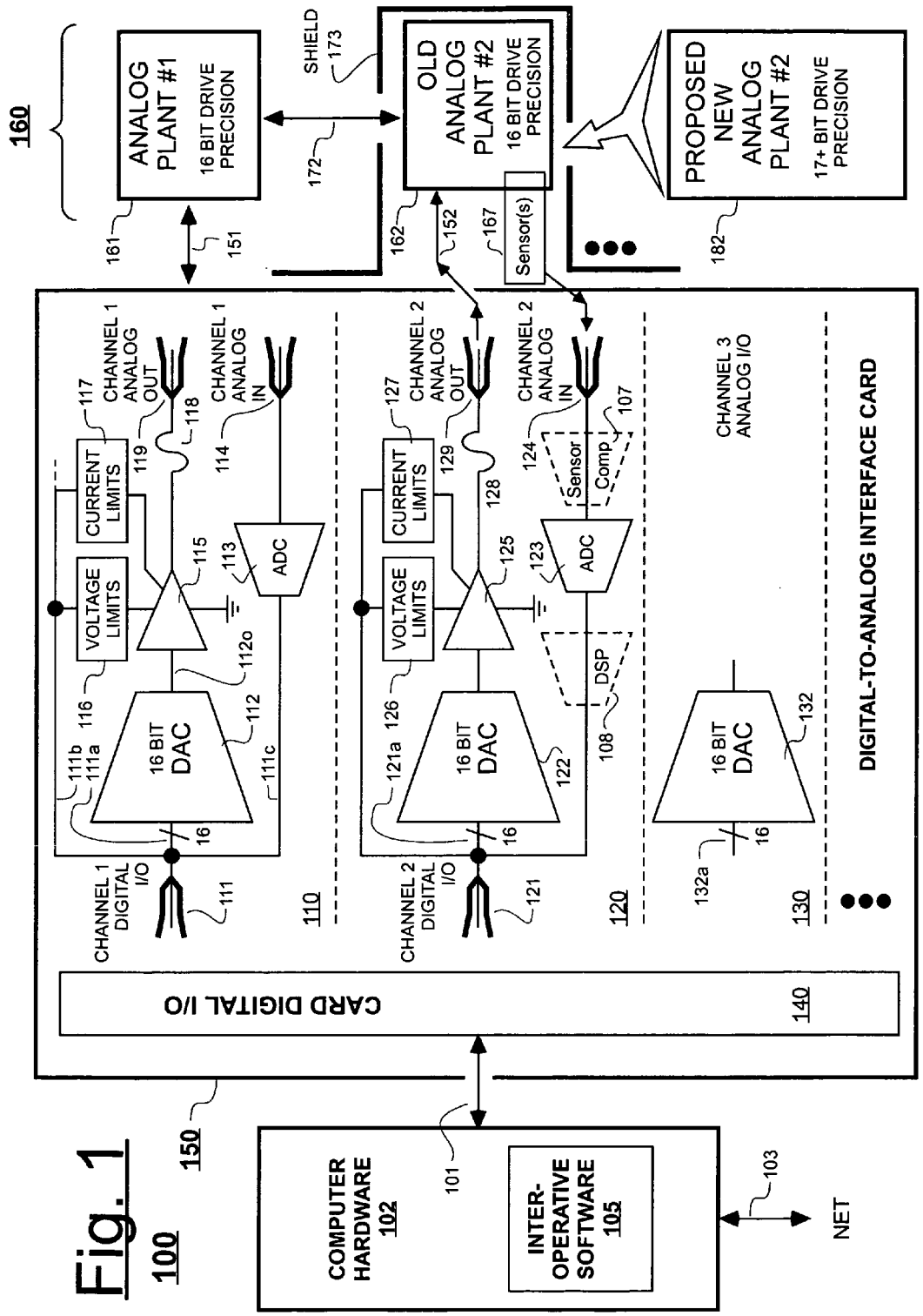
FIG. 1 is a block diagram of a system having digital-to-analog converters (DAC's) where the apparent output resolution of one or more of the DAC's can be increased by a method of the invention.

FIG. 1 is a block diagram of a digital-to-analog converting system 100 to which the here disclosed invention may be applied. Within the illustrated system 100, a bidirectional bus 101 (serial and/or parallel) carries representations of digital drive signals 111a, 121a, 132a, etc. that are to be supplied to corresponding, 16-bit digital-to-analog converters 112, 122, 132, etc. by way of a digital front end interface unit 140. The interface unit 140 resides within a multi-DAC, digital/analog interface card 150. Corresponding analog drive signals 119, 129, etc. emerge on back-end analog lines (e.g., 151, 152) of the digital/analog interface card 150 to drive respective analog plants such as 161 and 162.

It is assumed for purposes of the illustrative example that one of the analog-driven plants, 162 appears to users as having an effective resolution of no better than 16 command bits, this corresponding to the 16 bit resolution of the DAC 122 that drives that plant 162. It is assumed that users want to improve the apparent, commanded resolution of plant 162 by perhaps replacing this 16-bit analog-driven plant 162 with a new one, 182 having a greater apparent resolution, that of say 17 or more command bits.

The typical end-user will not appreciate that it is the fault of the DAC 122 buried inside of the digital/analog interface card 150, rather than the fault of the old analog-driven plant 162 for why plant 162 appears to have an effective resolution no better than the 16 command bits. Many analog plants are actually able to provide much higher precisions of movement or other responses than what may be apparent from the way they behave when driven by a DAC (e.g., 122) of limited characteristic resolution (e.g., 16-bits). Examples of such analog-driven plants may include those having analog-driven electrical motors, those having analog-driven piezo-electric actuators and those having analog-driven voice coils; to name just a few. The analog actuators typically have an ability to provide much finer graduations of digitally-controlled movement or other response than what may be apparent to end users from the way the actuators behave when driven by a DAC (e.g., 122) of limited characteristic resolution (e.g., 16-bits).

Even if a shrewd sales-person is able to convince an end-user that he or she should replace their old plant 162 with a newer plant 182 that has been independently shown to provide better response precision, the end user will not see any appreciable improvement of performance in terms of resolution. The problem is that, when the original analog-driven plant 162 is ultimately replaced by the new and supposedly-higher resolution, analog-driven plant 182; it will still be necessary to also increase the effective output resolution of the corresponding, plant-driving DAC 122 if the better response precision is to be seen in the overall system 100. Replacement of DAC 122 with a higher resolution one is often not a trivial problem for reasons that will become apparent shortly.

Quite often the original plant 162 and its corresponding DAC 122 are integral parts of a more complex, overall system 100. The illustrated example includes original plants 161 and 162 that communicate with each other via coupling 172. The illustrated example 100 further includes a combination of computer hardware 102 and interoperatively integrated software 105 which are coupled to one another and perhaps to other hardware/software combinations (e.g., via net 103, or due to error corrections provided by DSP 108—described later) in order to produce the digital drive signals 111*a*, 121*a*, 132*a*, etc. which are generally commanded by parent command signals provided over interface bus 101 but can be modified by localized corrections signals such as might be provided from local DSP's (i.e. 108). Even in a simpler case where the computer hardware 102 is a stand alone general purpose computer rather than part of a more complex network (103), in modern systems it is often the case that the computer hardware 102 and its interoperative software 105 execute a complex set of operations in order to interface with the card interface unit 140 and to create the appropriate pattern of digital communications over bus 101 that will cause intercoupled plants 161 and 162 to behave as desired. More specifically, it may be the case that software 105 needs to obtain digital feedback signals that flow back from first analog plant 161 via ADC 113 of channel #1 and interface unit 140 before the software 105 can determine what magnitude of new drive signal 129 is to be commanded for application to the second plant 162. In other words, complex and intertwined feedback loops may exist in system 100. Improving the apparent precision of second plant 162 will not occur simply by replacing plant 162 with newer plant 182 and replacing DAC 122 with a newer DAC having a greater number of physical input bits. It may be that the whole, digital/analog interface card 150 has to also be replaced.

Use of digital/analog interface cards like 150 is common practice in the industry when interfacing between digital circuitry 102/105 and analog circuitry (e.g., that of lines 151, 152) is desired. The reasons are many fold, although of course, customized DAC's can be embedded wherever desired. A number of commercial enterprises have specialized in the development of digital-to-analog-to-digital interfaces and have invested many years into developing general use systems. It would be foolish for end users to re-invent the wheel, so to speak. The commercially available, and mass produced, analog/digital interface means such as 150 provide a robust and reliable way (as proven by field testing) of interchanging signals between the digital and analog domains without the end users having to concern themselves with details concerning environmental or other variants such as temperature changes, voltage supply changes, manufacturing process drifts and so on. More specifically, the commercially-available digital/analog interface cards (e.g., 150) typically include a large number of data channels such as 110, 120, 130, etc. each having a respective digital-side I/O port such as 111 for interchanging digital input and output data signals and each further having a channel analog output such as 119 for outputting analog signals and an analog input port such as 114 for receiving analog signals. The respective digital-to-analog converters (DAC's) 112, 122, 132, etc. in the respective channels will generally each have a same number of physical input bits (typically 8 or 16 bits). The number of DAC input bits is often determined by mass market considerations such as customer-tolerable cost, average customer-required speed, stability, accuracy and the output operating range desired by the average customer. Users can elect to utilize less than the full gambit of characteristic input data bits provided at the input (e.g., 111*a*, 121*a*, 132*a*) of each DAC. However the users cannot change the maximum number of input bits provided at the input port (111*a*) of each DAC. Therefore, if a given DAC 112 has only 16 operative input bits, the basic output resolution of that DAC will be fixed at $1/(2^{16})$ times the full output swing of the DAC. Heretofore, this maximum basic resolution could not be enhanced unless the DAC 112 or 122 was replaced with a DAC having a greater number of physical input bits. It is to be understood that some commercial DACs offer a so-called 'zooming function' which lets the user reduce the analog output voltage range programmably and temporarily, thus allowing the $2^N$ selectable steps of the DAC output to be distributed over a smaller voltage range, thereby improving the per-step resolution of the DAC while the zoom mode is in effect. However, the zoom mode has clear drawbacks. It adds to complexity on the analog output side of the DAC because of the need to accurately support two or more output voltage ranges. When the zoom mode is in effect, the input domain of the driven plant (e.g., a positioned X-Y table) is reduced and so is its corresponding output range (e.g., the X-Y table is restricted to a smaller addressable position range than possible when zoom mode is not in effect). Thus the zoom mode does not alter the basic resolution of the DAC over its full output range. Aside from using zoom mode, DACs can also be ganged to gain resolution, with obvious penalties in cost, complexity, accuracy and stability.

Since the more-conventional digital/analog interface cards 150 are mass produced to meet mass consumer requirements, it is generally not possible for an end user to demand that a given interface card be provided with a non-standard digital output resolution (i.e., a basic output resolution of more than $2^{16}$ gradient steps). Although 18-bit and 20-bit and even higher-resolution DACs may be commercially available, they tend to have drawbacks in terms of higher cost, and poorer speed, stability and/or accuracy, as well as possible software incompatibility. In addition, changing to a higher-resolution DAC may require changing the structure of the main data bus which drives it, and all associated circuitry, as well as the numerical representations used throughout the firmware and software which drives it, which may in turn necessitate revisions to mathematical and control subroutines embedded throughout the system. Accordingly, end users find themselves usually stuck with the originally-installed DAC(s) and its/their characteristic output resolution(s), as dictated by mass-producers of the analog/digital interface cards. Even in cases where users have elected to utilize customized DAC designs rather than the mass-produced cards, users nonetheless eventually find themselves married to the already-installed architectures (with fixed number of physical input bits for the DAC) due to consideration of factors such as sensor calibration, servo loop stability, and so forth as will now be seen.

There is more to analog/digital interface cards (or other such circuitry) than merely picking the number of input bits nodes on each DAC. The DAC's 112, 122, 132, etc. of each respective I/O channel 110, 120, 130 etc. are designed to provide a manufacturer-chosen amount of accuracy and drift resistance in light of environmental changes such as temperature changes and power supply changes. Programmably-controllable auxiliary functions are typically provided in each I/O channel. For example, the maximum voltage swings of the analog output 119 from DAC 112 may be defined by a programmable controllable output amplifier 115 whose voltage swing limits are defined by user-programmable section 116. Similarly the limits (e.g., minimum or maximum) on current values may be programmably established by a user-programmable current limiting section 117. Certain output protective features may be provided by items such as fuse/surge protector 118. Characteristics of this output means 118 may be programmably controlled by channel characteristic data sent over control bus 111b to the respective programmable units, including 116 and 117. Analog feedback information may be sent from analog input port 114 through a corresponding analog-to-digital-converter (ADC) 113 which is appropriately pre-calibrated by user or manufacturer calibration activities to provide corresponding digital feedback information on bus 111c. Buses 111a, 111b and 111c combine to define bidirectional I/O port 111 on the digital side of channel #1 (region 110). This channel #1 digital I/O port 111 operatively couples with the card's digital I/O interface block 140. Interface block 140 may provide a programmably defined scheduling of time-based multiplexing of signals between the various digital I/O channels 110, 120, 130 and respective digital signals carried on bidirectional bus 101.

Specialized software 105 is often needed for controlling the scheduling of digital data transmission through interface block 140 to the respective I/O channels 110, 120, 130 and also for controlling the specialized characteristics of each channel. The voltage limits established in block 126 may be completely different from those of block 116 and similarly the current limits in block 127 may be different from those of 117. ADC 123 may be calibrated differently from ADC 113. The interoperative coupling 172 between the old analog plant #1 (161) and the old analog plant #2 (162) may be of a specialized nature, particularly if there is a unique coupling through the illustrated noise shield 173. Old analog plant #2 (162) may have one or more special sensors 167 whose outputs are specially conditioned or compensated-for, or calibrated by way of a corresponding one or more, sensor conditioning and/or compensating and/or calibrating circuits such as illustrated at 107. Such sensors 167 may be housed in special shields such as represented by 173 and may be integral parts of one or more closed servo loops, where the servo loop(s) further include DAC 122 and optionally, one or more of the sensor-compensating circuitry 107 and a digital signal processing circuit (DSP) 108. The operation of DSP 108 may rely on specialized software/firmware implemented therein and working in operative cooperation with calibrations and/or compensations (e.g., filtering) provided by sensor-compensating circuitry 107 and the architecture of the closed servo loop(s). The latter, sensor-compensating circuitry 107 may be pre-calibrated and/or of a programmably calibratable type where its calibration is functionally intertwined with sensors 167 and with operations performed by DSP 108 and/or by software 105 within computer 102. The software package 105 may rely on a pre-established balances and/or settings between various signals levels and on pre-established nuances among the interconnections between various I/O channels (e.g., 110 and 120). Thus a user may face a highly complex situation where any small change may upset the whole apple cart, so to speak.

In view of this, the proposed substitution of new plant 182 in place of old plant 162 could create more problems than any it might solve. For example, the illustrated noise blocking shield 173 may substantially surround not only the old analog plant 162 and sensor(s) 167, but also most of the remaining circuitry of I/O channel 120 so that analog signals are not exposed to environmental noise. Thus, when it is proposed to improve the drive precision of the old analog plant #2 (162) from 16 bits to say 17 or more bits of precision, this becomes a very difficult proposition because it is impractical to remove the original analog plant 162 from within its shielding 173 and/or attached sensor(s) 167 and to risk changing all of the preestablished and predeveloped calibrations, compensations, control loop structures, parameters and balances that are predefined between I/O channels 110 and 120 simply to gain the advantage of a slightly better precision for the plant #2 position. In light of this, when users previously wished to considered enhancing the drive precision of a given plant in such a complex system as 100, the impracticalities of the proposal often deterred users from going further with the idea. They preferred to stick with the old and well tested reliable system that is already known to work. In many cases, users were, in essence, financially married to a specific brand or family of digital-to-analog interface cards (or to other pre-designed D/A circuitry) and all of the nuances that go with them because it would be too expensive to change. It was simply not feasible to alter the entire system of interoperative software and intertwined (172) hardware and/or software (105) in order to gain an extra bit of drive precision. (Note that each extra bit doubles the precision of the output. A single extra bit can make a tremendous difference in how a driven plant performs.)

Figure 2:
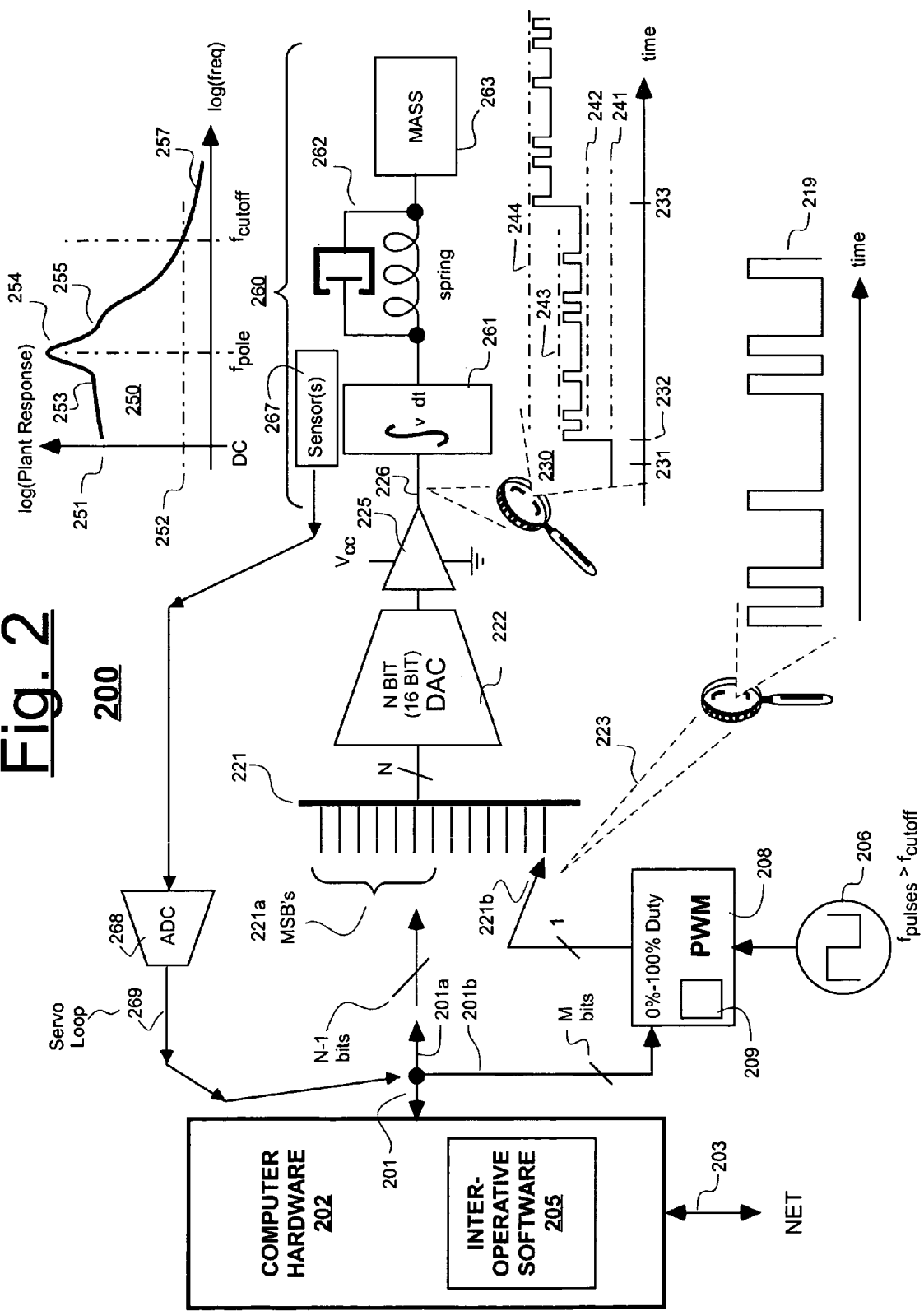
FIG. 2 is a schematic diagram showing details of a method which increases the apparent output resolution of a corresponding DAC by injecting additional high frequency and unipolar energy into a spectral region beyond a cutoff frequency of the driven plant.

FIG. 2 schematically shows how the present invention makes it possible to increase the apparent resolution of a given analog plant that is coupled to a pre-existing DAC, even if the DAC is inside a predefined and closed servo loop. The present invention allows users to keep substantially all of the old system intact while asking them only to make minor change and relatively simple changes in order to increase the apparent resolution of a given analog plant, say plant 260 in this case. Moreover, the present invention is not limited to upgrading old designs. New designs may take advantage of the invention by using DAC's of smaller characteristic resolution (e.g., 8-bit instead of 10-bit) than what is apparently required for the specified resolution of the driven plant. The smaller DAC's may have one or more advantages associated with their use, such as lower cost, better accuracy, better stability, smaller footprints on the printed circuit boards or in the layout of an encompassing integrated circuit.

In accordance with one embodiment of the invention, a high frequency, pulse width modulating means (PWM) 208 is interposed between at least one of the input bit nodes 221b of the plant-driving DAC 222 and the source 202 of the DAC-driving signals. Most of the digital drive bits 201a from the digital source 202 can continue as before (or as conventionally designed) to the other input bit nodes 211a of the N-bit wide input port 221 of DAC 222. There is little, if any, interference with any pre-existing servo loop 267-268-

269 that may be present. The interposed PWM 208 (or other pulse forming means) typically drives just one (usually the least significant bit node, LSB) entering the DAC input port 221. In the illustrated example, the more significant number of, N−1 bits of a DAC driving signal 201a/201b that has M plus N−1 bits, flow to a corresponding N−1 of the more significant input bit nodes 221a of DAC 222. A subset 201b of M, less significant bits flow to a duty-cycle control port of the PWM 208 so as to define the duty cycle of the pulsed output 221b of that PWM as being between 0 and 100 percent. Typically, M will be greater than 2 and N−1 will be greater than M. The $2^M$ choices for selectable duty cycles (or selectable, predefined modulation waveforms) that the M bits provide will typically include at least one of a 0% duty cycle choice and a 100% duty cycle choice. A high frequency clock 206 drives the PWM 208. The frequency, $f_{pulses}$ of the driving clock 206 is selected to be sufficiently large so that an output pulse train 219 of PWM 208 can be tailored to have relatively narrow-width pulses and thus a frequency content that substantially occupies a frequency domain of the driven plant that is beyond a predetermined cut-off frequency, $f_{cutoff}$ of the driven plant 260. The specific sequence of relatively narrow pulses in the illustrated train 219 (the pseudo-bits train) and the specific width and/or waveform of each of those pulses can vary from application to application. The magnified example 223 is merely for purposes of exposition. It will be understood shortly how the energy content versus frequency of the pseudo-bits pulses 219 correlates with the response-versus-frequency behavior of the driven plant 260, where the latter behavior is exemplified by graph 250.

The driven plant 260 either inherently includes, or it can often be easily altered to include some form of low-pass filtering means (not necessarily electronic, could include a mechanical add-on). This low-pass filtering means functions to smooth out the energy of the narrow pulses 219 output by the PWM 208 and to thereby create a much lower frequency response or a substantially DC output response to the PWM-generated train of uni-polar pulses 219. By way of example, in a simple alteration to plant 260, additional mass might be added to a pre-existing and driven mass 263 so as to increase the inertia of the system if it is not already sufficiently high to provide the desired low-pass filtering function. Alternatively or additionally, the electronics of the analog drive amplifier 225 which drives the plant 260 may have or may be programmably alterable to provide the desired, low-pass filtering behavior. Alternatively or additionally, an electrical or other actuator within the driven plant may include a fixed or programmable integrator means 261 for providing the desired pulse smoothing function or at least part of it. (More broadly speaking, and as will be seen from the shaped waveform example 319 of FIG. 3, the integrator means provides at least part of a smoothing function as a response to the high frequency, specially-modulated content of special-modulating input signals like those shown at 319.) Alternatively or additionally, the mechanical components 262 of the driven plant may include a combination damper-and-spring like means for providing such smoothing of high frequency pulses (or more broadly, of the effects of the special-modulating input signals). Moreover, the combination of spring-and-mass 263 of the driven system may provide a mechanical integrating function. Accordingly, when the least significant bit (LSB) node 221b of DAC 222 is driven by the narrow-width pulses 219 output by PWM 208, the various integrating factors 261–263 that are either present or are added to the driven plant 260 function to smooth out the energy of those narrow-width, unipolar pulses and to provide a substantially DC response to the high frequency content of those pulses 219.

The resultant effect of the high frequency pulsing on line 221b and the low pass filtering along the output path of DAC 222 is that the N-bit DAC appears to have an output resolution greater than $2^N$ gradient steps. Instead, it appears to have an output resolution of $2^{(N-1)+M}$ gradient steps, where M is the number of bits on port 201b that define the effective output duty cycle of PWM unit 208. The $2^{(N-1)+M}$ value assumes that M is being efficiently used to define $2^M$ unique pulse trains 219. If some of the maximum of $2^M$ unique pulse trains overlap in providing a same effect to the driven plant 260, then of course, the apparent output resolution can be less than $2^{(N-1)+M}$ gradient steps.

For better understanding of the mechanisms involved, a first graph of amplifier output voltage versus time is shown at 230. Graph 230 represents the pre-integration signals output by amplifier 225 onto line 226 before the low pass filtering or integration-over-time process of one or more of element 261–263 takes effect. (It is assumed momentarily that amplifier 225 does not provide some or all of the low pass filtering, although more broadly speaking, it could, and more practically-speaking the amplifier 225 ordinarily will provide low pass filtering at least to some extent.) The dashed horizontal lines in graph 230, namely lines 241, 242, 243 and 244 represent the discrete output steps attributed to the characteristic output resolution of DAC 222 ($2^N$ gradient steps). If the PWM module 208 were not present, and one of the M>0 bits of bus 201b simply connected instead to the LSB input node 221b of the DAC, then the output voltage of amplifier 225 would essentially be restricted to being either at discrete level 241 or 242, or 243, etc. for a predefined length of time (which time is longer than the widths of pulses in train 219). However, since the PWM unit is present, the output on line 226 can be rapidly modulated between two or more of the discrete levels, such as between 242 and 243, where the rapid modulation is in accordance with an effective duty cycle established by the M bits of control bus 201b.

It is seen in the example of graph 230 that, at a first time point, 231 the M bits command a duty cycle of zero percent and the output line 226 remains at discrete level 241 for a relatively long period of time. However between second and third time points, 232 and 233, a first non-zero and not-100% duty cycle is commanded by the M bits to thereby produce the illustrated, fast pulsing between discrete levels 242 and 243. Beginning at the third time point, 233, a different duty cycle (0%<duty<100%) is commanded by the M bits to provide yet another high frequency pulsing of the output voltage between discrete levels 243 and 244. Integration means 261–263 will substantially integrate the effects of the high frequency pulses between time points 232 and 233 to provide an apparent response level (steady state) between discrete levels 242 and 243 corresponding to the commanded duty cycle (0%<duty<100%). It will appear to users of the driven plant 260 as if the output resolution of the N-bit DAC 222 had been increased to that of a DAC having a number of input bit nodes (221) greater than the characteristic number, N (e.g., to a value greater than 16). Note that this increase in apparent resolution can be achieved without having to make any major changes to the driving computer hardware 202 (if any) or to the interoperative software 205 (if any) or to the DAC 222 or to the servo loop 269 (if any). Sensor(s) 267 is/are understood to measure the post-smoothing, analog response of the driven plant 260 and to transmit corresponding electrical measurement signals (conditioned or not) to ADC 268. An error reducing means (not shown)

within servo loop 269 can be operated to reduce error between the currently measured state of the plant and the desired state per conventional servo loop techniques. The PWM 208 enables the servo loop 269 to achieve reduced amounts of error due to the enhanced resolution now possible with the specially-modulated DAC 222.

Referring to the plant response graph shown at 250 (which response is assumed to be that of plant 260), many conventional plants have an inherent resonant behavior at a particular one or more frequencies, such as indicated by the peaked behavior illustrated at 254 for pole-response frequency, $f_{pole}$. It is often desirable to keep the energy versus frequency content (and/or energy versus phase content) of the applied PWM pulse trains 219 substantially outside of the one or more pole-response frequencies/phases of the driven plant so that the plant (and/or the servo loop 269) will not enter into unstable and/or undesirable oscillatory behavior as a result. The intent is to controllably position the plant response at a duty-cycle-determined level between the discrete commandable levels (e.g. 241 and 242) of the given DAC 222 rather than to have it oscillate or shoot wildly outside of those bounds. A programmable memory 209 may be included in PWM unit 208 for defining the specific pulse train sequences 216 (or more broadly-speaking, for defining the specific, special-modulating waveforms) that will be output in response to the commanded duty cycles of input bus 201b and will have the respective duty cycles. These programmably-defined sequences may be empirically modified so that they avoid the creation of special-modulating drive signals (e.g., pulse trains) having a substantial amount of their energy located in the frequency region of the pole-response frequency or frequencies, $f_{pole}$(s) of the driven plant and/or having a substantial amount of their energy phased so as to induce phase-driven pole behavior by the driven system. (Similarly, if certain ones of tested, drive signals (e.g., pulse trains) are found to induce undesirably unstable behavior in the servo loop 269, memory 209 or another such means may be programmed to preclude the use of such troublesome pulse trains.) Most of the energy in the frequency domain of the created pulse train 219 will be designed to be above the pre-defined $f_{cutoff}$ of the driven plant 260 (or centered about an anti-pole—see 355 of FIG. 3) so that this specially-modulating energy will be converted into response energy that is of much lower frequency or of a substantially DC nature rather than producing a high frequency response at the plant output. Of course, there may be situations where it desirable for the plant (or servo loop) to respond resonantly (near its poles) to certain PWM-output pulse trains (219) and the programmable memory 209 (if any) of the PWM unit 208 may accordingly be programmed to produce such a resonance exciting train when commanded to produce a uniquely selected duty cycle that would otherwise not be commanded by the driving system 202.

In terms of more specifics, Fourier analysis theory reveals that sharp-edged excitation (idealized pulsing) of a system will contain energy at all frequencies, meaning it will often cover the pole or resonant frequencies of the excited system. This can happen even though most of the excitational energy of the input signal (LSB signal 221b) is substantially higher than the cutoff frequency that is characteristic of the excited system. After all, the cutoff frequency merely defines a point such as in the Bodé plot of the system response where the response falls off to a degree established by convention, such as the 3 dB or 6 dB roll-off point. With sufficient excitation at the input, enough excitational energy may get through in the pole(s) region of the plant's response frequency domain so as to cause trouble at the system output. In these situations some portions of the special-modulating input signal can be pre-processed in terms of waveform and/or phase control to thereby reduce or minimize undesired vibrational behavior in the plant response. (See for example: "Comparison of Filter Types Used for Command Preconditioning in Vibration Suppression Applications" by D. Economoua, C. Mavroidisb and I. Antoniadisa of National Technical University of Athens, Greece and of Rutgers University, New Jersey.)

Figure 3:
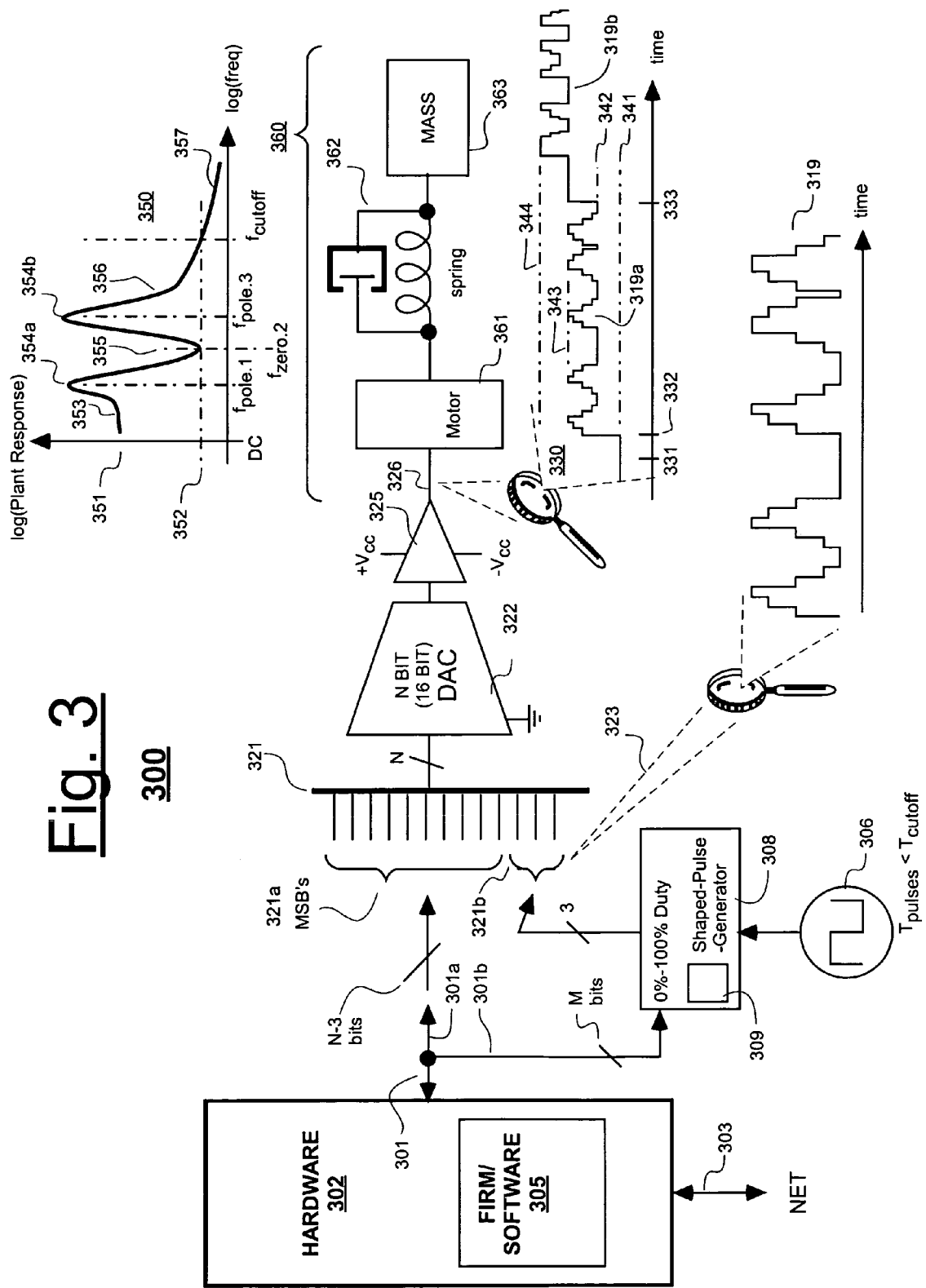
FIG. 3 is a schematic diagram showing a resolution-enhancing system which includes vibration-reducing means.

One technique for suppressing vibrational response in a discretely-excited system relies on time-shifting the discrete excitation levels (digital input levels) in a fractional-phase manner in accordance with the teachings of U.S. Pat. No. 5,638,267 (whose teachings are incorporated herein by reference.) The vibrations induced by one discrete level are timed (phased) to cancel out or reduce the plant vibrations induced by a subsequent, discrete input level. This phase-based cancellation technique is known in the art as "Input Shaping®" (where the latter is a trademark of Convolve Inc. of New York, N.Y.). In accordance with an aspect of the present invention, a vibration suppression technique, such as for example, Input Shaping® is applied to the specially-modulated input bit nodes of a given DAC so that out-of-phase resonances of the excited plant are timed to destructively interfere with one another thereby causing the problematic resonances to be cancelled out or significantly reduced. More details will be provided when FIG. 3 is described below.

The exact value of the cutoff frequency $f_{cutoff}$ for a given plant 260 (and/or the values of other poles (resonances) and zeroes (troughs, anti-poles) along the frequency and/or phase spectrums) will generally vary from one application to another and will depend on what level 252 is considered to be a negligible response in the given application as compared to a non-negligible response magnitude 251 at frequencies below $f_{cutoff}$. Given the variability of applications, no generalized numbers can be given here for $f_{cutoff}$ or resonant or trough frequencies or phase-based control of the output. Those skilled in the art will appreciate what amount of response roll-off 252 will be desired relative to the dominant output levels 251 of a given system in order to achieve acceptable results in accordance with the spirit of the invention.

The "low-pass" filtering function represented by the reduced plant response at 257 in graph 250 is merely illustrative. It is possible for some plant systems to have one or more additional trough-frequencies (anti-poles or zeroes as opposed to poles) that can be exploited for similar kinds of effects. The energy versus frequency content (and/or energy versus phase content) of the specially produced, pulse trains 219 of magnification 223 can be tailored to substantially fall within the one or more trough-frequencies of such plant (near or at the zeros) so that the energy content of the pulses 219 is converted into a plant response of substantially lower frequency (e.g., at or near DC). The result would be roughly the same as pulsing above $f_{cutoff}$. The immediate output 226 of the DAC or a subsequent output amplifier 225 would be seen as having major steps 241–244 with the special-modulating pulses (where their individual pulse widths can be defined as $T_{pulses} < T_{cutoff}$) riding on those major steps as is shown between time points 232–233. The various filtering functions of the plant, including at least one of a low-pass filtering and trough-response (see 355 of FIG. 3), would position the plant response in a state between the states associated with the major steps 241–244. As such, the plant will be seen to have a finer output resolution than it characteristically had before the invention was applied.

Although PWM unit 208 is schematically illustrated as being an apparently "hardware" implementation interposed between computer hardware 202 and DAC 222 this is not necessarily so. The PWM module 208 (or more broadly speaking, the generator and/or selector of the special-modulation signals, i.e., 219, 319) may be implemented entirely in the software portion 205 of the driving computer 202. If computer 202 is operating at a sufficiently high switching rate and it has bandwidth available for directly commanding high frequency special modulation signals such as pulse train 219 to appear on a given input bit node (e.g., the LSB node) 221*b* of a given DAC (222 and/or others within a given DAC card 150), then additional hardware is not needed for implementing the function of PWM 208 or its equivalents, namely, generating high frequency, special-modulating signals such as in 219 with appropriately-selected, effective duty cycles for causing plant response to occur between the discrete response steps corresponding to characteristic DAC levels 241–244.

Additionally, it is within the contemplation of the invention to have multiple copies of PWM unit 208 (or its equivalent) implemented in hardware and/or software, each (208', 208", 208''', etc.) for a different DAC channel (110, 120, 130, etc.) and each being uniquely programmable to accommodate the response versus frequency and/or phase characteristics (e.g., 250) of the unique analog plant that is to be respectively driven by the corresponding DAC channel. Even where a same duty cycle is to be commanded for two different channels, the special-modulating waveforms (e.g., 219) which implement those same duty cycles in the different channels may be different because the response versus frequency/phase characteristics (e.g., 250) of the unique analog plants may be different. Thus it is advantageous to allow for programmable association of desired duty cycle values with different pulse train waveforms 219 (or shaped waveforms such as 319 of FIG. 3) for each channel through the use of programmable memory 209 (or 309 in the case of FIG. 3). It is further within the contemplation of the invention to have scheduling software included within the interoperative software package 105/205 for managing the scheduling of generation of the different pseudo-bit pulse train waveforms 219 (or other special-modulation waveforms, i.e., 319) for each channel through the use of an I/O interface block such as block 140 of FIG. 1. Some analog plants may have a relatively low cutoff frequency (say about 50 Hz or less) while others may have a relatively high cutoff frequency (say about 500 Hz or more) and the more typical plants (that is, table mass in combination with motor drive) will have their cutoff frequencies in the range of about 100 Hz–300 Hz. Accordingly it will be advantageous to give higher priority to the scheduled generation of the pseudo-bit pulse trains (219) for the analog plant or plants with the higher cutoff frequencies (e.g., $\geq$500 Hz) than to those with lower cutoff frequencies (e.g., $\leq$50 Hz). The scheduling may be carried out by sending appropriate, serialized commands to the digital front end interface unit(s) 140 of a corresponding one or more DAC cards that contain the circuitry for the various digital/analog I/O channels. (Although certain specific frequency values are given here simply for purpose of illustration, it is to be understood that the invention contemplates plants with much wider bandwidths than merely 100 Hz–300 Hz. This was just an example.)

From the examples given above, it may be seen that the illustrative system 100 of FIG. 1 may be left substantially intact such that hardware aspects of the illustrative system 100 appear to be untouched and only minor changes need to be applied to the software portion 105 in order to implement one or more special modulation train generators equivalent to the PWM 208 of FIG. 2. It is to be noted that pulse width modulation (PWM) per se is not necessary for generating the variable duty cycle pulse trains 219. Duty cycle can be varied by other means as well, including rate modulation of fixed width pulses. It is within the contemplation of the invention to use any appropriate means for producing variable duty cycle modulation trains 219 of various waveforms and having the characteristics described herein.

In view of the above, it is seen that system 100 of FIG. 1 may be modified by minor hardware and/or software changes to thereby cause the variable duty cycle trains 219 to appear on a given one or more input bit nodes (e.g., 221*b*, does not have to be LSB) of corresponding plant driving DACs such as 222, and that such modification can alone make it appear as if the old analog plant 162 had been replaced by a newer analog plant 182 of increased commandable precision (e.g. 17 bits of precision rather than 16 bits). This, of course, assumes that the original analog plant 162 had an inherent drive precision that exceeded that of the basic, N-bit DAC 122 and that the plant had some inherent form of low-pass filtering and/or other integration 261. These assumptions are valid for virtually all driven analog plants. If the original analog plant 162 does not have a sufficient amount of inherent, low-pass filtering or integration 261, it is often easy to add such on (e.g., by increasing the inertia of the plant).

Examples of driven plants that usually qualify include high-precision positioning systems where various types of high-precision motor means are used as actuators for finely positioning mechanical components. Such motor means may include: piezoelectric and/or magnetostrictive and/or electrostatic and/or electrostrictive and/or electro-magnetic elements and/or thermally-actuated elements. Such motor means may alternatively or additionally include: microsteppers, linear or planar motors as well as rotary types, actuators based on shape memory materials, and actuators driven by pneumatic, hydraulic; fluidic or thermal expansion or contraction mechanisms. The inherent drive precision of such positioning elements is typically much finer than the drive precision commanded by the 8–16 bit DACs 122 that drive them. (20-bit DAC's are also commercially available but these tend to have drawbacks such as increased bus widths, higher cost, greater drift, less accuracy, and so forth.) The driven masses of the positioning system typically have spring, damping, and mass constants which cause them to inherently behave as low-pass filters that smooth off high frequency drive inputs such as the specially-modulated signals used by the present invention. Accordingly the present invention may be easily applied to such piezoelectric and/or other such finely-driven positioning systems without requiring users to pull out the original DAC 122 from the interface card 150 or to pull out the old analog plant 162 from within its electromagnetic shield 173 (if any) or without having to perform major surgery on any of the software or hardware other parts of the overall system 100. Instead, just a minor change to the driving software 105 can implement the PWM 208 shown in FIG. 2 or its equivalent. Alternatively, an entirely new system can be constructed which offers greater-than-N bit effective output resolution while using an N-bit DAC (where N is greater than 2) but without penalty associated with extra-wide DAC's (e.g.

20-bit or wider DAC's) in terms of technical parameters such as stability or accuracy or compatibility with legacy software.

An example of an application of the invention is now given. A piezoelectric driven positioning system was obtained having a positioning table with a full travel distance of 15 micrometers (15 μm) and a drive electronics including a digital-to-analog converter (DAC) whose resolution was limited to a 10 bit characteristic value and to having an output range of −10V to +10V. The response cutoff frequency of the combination of the piezoelectric drive element and the mass-spring parameters of the positioning table was taken as being approximately 4 kHz and a resonant peak for the combination was observed at about 3 kHZ (in other words, the cutoff was taken as being ⅓ above the resonant frequency). The positioning table's drive electronics were structured to receive an analog command in the range 0V to +10V, thus half of the DAC output range was unusable. Given the original 15 μm maximum travel distance of the table and the circuitry-forced 10 bit resolving limit of the DAC, the finest resolution provided by the system is calculated as 15 μm/(($2^{10}$)/2), or roughly, 29 nanometers (29 nm—where the last divide by 2 is because half the DAC output range was unusable). The table was equipped with a position sensor having a range of 15 μm and a 16-bit, sensor-reading DAC, giving a theoretical sensor sensitivity of 0.45 nm per step. (Actual position-sensing resolution would be coarser than this due to vibrational noise and other factors.) The principles of the invention were applied by way of software modification to increase the apparent, finest resolution of the overall positioning system to being 1 nanometer or better. The apparent resolution of the 10-bit DAC was increased by 1–3 bits. Under the 3 bit improvement regime, the new, finest positioning resolution of the system was calculated to be approximately 15 μm/(($2^{13}$)/2), or roughly (29/8)nm=3.6 nanometers, which is better than the original 29 nm finest resolution previously offered by the digitally-commanded table system. In the 3-bit modification, 3 software commanded bits were used to select a respective one of 8 evenly-spaced, duty cycles in the range of 0% to 100% for driving the least significant input bit node (similar to 221b) of the 10 bit DAC. The frequency content of the special-modulating pulse train 219 was selected to be substantially above the assumed $f_{cutoff}$=4 kHz of the mechanical system. In one embodiment, the pulse drive sampling frequency was about 10 KHz. Since modern DACs are able to handle frequency sampling rates as high as approximately 200 KHz or better, the original 10 bit DAC in the system was easily able to keep up with the 10 KHz update rate of the driving software. The position sensor was observed to verify that the table was indeed moving in increments of about 3 nm to 4 nm each rather than about 29 nm each. (Although the position sensor had a theoretical sensor sensitivity of 0.45 nm for its LSB, the actual sensitivity was taken as being about 1 nm, and thus the observations were taken as not being able to resolve to better than 3 nm to 4 nm per commanded table step in this experiment. Nonetheless the experiment successfully demonstrated a significant improvement in the digitally-commanded resolution of the positioning table, well below the characteristic value of 29 nm per digitally-commanded step.)

While the above experiment demonstrates the workability of the invention for a piezoelectric driven, positioning table having a cutoff frequency of about 4 kH, more generally speaking, the cutoff frequency for many types of mechanically driven, fine positioners can be in a wide range depending on table mass, drive power and the various spring and dampening parameters operating within the system. Cutoff frequencies can be expected to extend from as low as about 100 Hz to 500 Hz to as high as about 3 kHz to 10 kHz. Variable duty cycle pulse trains (219) having maximum pulse widths (T=1/f) corresponding to a sampling rate much greater than about 10 kHz can be easily handled by most modern DACs. If the 10 kHz value is assumed to be the $f_{cutoff}$ for all finely positioned mechanical systems and a pulse-production rate of about 50 kHz–100 KHz or higher is used, then the plant system should inherently smooth out the high frequency content of the narrow-width pulses in the pulse-width modulated signal 219 to thereby provide a relatively smooth response of the desired degree of fine resolution.

Aside from piezoelectric actuators, the invention may be implemented with a large number of other types of actuating elements including, but not limited to, micro-stepper motors, electrostatic actuators (such as used in MEM's), thermal actuators and magnetic voice coil actuators. In cases where the driven plant (e.g., 260) has one or more undesired resonant frequencies (indicated by resonant 254), various vibration-suppression techniques may be used for effectively providing a desired duty cycle while still avoiding excitation of the resonant frequency or frequencies, $f_{pole}(s)$ of the driven plant 260.

One well known technique is known as Input Shaping® and a precursor to that technology was known as Posicast. Under the Input Shaping® technique, the digitally-created, special-modulating signals are organized in terms of timing and magnitude so that the resonant behavior induced by a first of the pulses/steps (or other waveform) is roughly 180° out of phase with the resonant behavior induced by a second of the pulses/steps (or other waveform). Thus the counterpart waveforms produce responses that interfere destructively with one another and undesired vibrational behavior is suppressed. Among the known vibration suppression techniques, one trademarked version is known as Input-Shaping® and is provided by Convolve Inc. of New York, N.Y. (See U.S. Pat. No. 5,638,267, whose teachings are incorporated herein by reference.) See further, U.S. Pat. No. 6,694,196 (issued Feb. 17, 2004 to Tuttle et. al and also incorporated herein by reference.) See yet further, "Input shaping for vibration-free positioning of flexible systems" by M N Sahinkaya of University of Bath, Claverton Down, Bath BA2 7AY, UK, Proc. Instn. Mech. Engrs. Vol 215 Part I (2001).

In accordance with the invention, Input Shaping® and/or other vibration suppression techniques may be applied to define the special-modulating signal(s) that is/are applied to the least significant input bits of a DAC or are otherwise used to add a high frequency ride-on modulation to the characteristic discrete output levels (e.g., 242, 243) of the given DAC. The one or more vibration suppression techniques may be used to reduce or prevent undesirable oscillatory behavior that may otherwise be induced by the special-modulating signals. If Input Shaping® and/or other pre-processing is also applied to the more significant bits (MSB's) of the specially-pulsed DAC, such pre-processing may continue in substantially unchanged manner.

FIG. 3 shows an example 300 where Input Shaping® is applied to suppress unwanted vibrations. Reference numbers in the "300" century series are used in FIG. 3 where practical to refer to items having similarly-numbered counterparts in FIG. 2 under the "200" century series. Accordingly, a detailed description of most components is not needed. One important difference is that FIG. 3 shows 3 LSB's in group 321b as being specially-modulated while a remaining N−3 of the original, N digital command bits are applied in more normal fashion to MSB group 321*a* of the DAC's input bit nodes 321. The specially-modulated input bits 321*b* are produced by a shaped-pulse generator 308. Magnification 323 shows a possible stair-cased waveform 319 for the shaped command pulses. In accordance with one aspect of Input Shaping®, instead of taking large swings between adjacent, major discrete levels (where the major discrete levels are more associated with the MSB's 321 rather than the LSB's), smaller and time staggered ministeps are taken in order to transition between the major discrete levels. Thus, instead of switching immediately from 0% to 100% of a jump between discrete major levels, a partial first jump up is taken 50% of the way. Then after a calculated delay, a further 30% of the full jump is taken. Then after another calculated delay, a further 20% of the full jump is taken. This is just an example. The magnitudes and associated delays of the ministeps are generally calculated by using a convolution function whose input parameters correspond to characterization parameters of the driven plant 360. When a reverse jump is taken from the 100% level back to the 0% level of a major step, the time staggered partial jumps may take the form of about 50% down first, then a calculated delay and about 30% down, then another calculated delay and about 20% down. Again, these are just exemplary of what an Input Shaping® result signal might look like. The actual waveform will depend on a variety of factors including how the driven plant is modeled, what convolution function is used, what number M of waveform-selecting or PWM-selecting bits is allowed or used in the design, and whether the Input Shaping® process is a pre-computed one or a real-time adaptive one. It is within the contemplation of the disclosure that the shaped pulse generator 308 may be structured to provide any one or more of such Input Shaping® processes, including use of precalculated, shaped waveforms and/or use of real-time, adaptively-determined, shaped waveforms. Other types of vibration canceling or vibration suppressing waveforms may alternatively or additionally be produced by the shaped pulse generator 308, either from waveforms stored in memory 309 or on a dynamically adaptive basis that is responsive to changing system parameters such as temperature, pressure, voltage levels, etc.

It is to be understood that the illustrated Y scale of waveform 319 is not a binary one, but rather can represent 8 possible levels in the inclusive range of 0% to 100% where 1 or 2 of the 8 levels corresponds to a respective one or two of 0% and 100% and where the other 7 or 6 represent intermediate levels which may be additionally commanded by the 3 input bits of LSB group 321*b*. Pre-computed, shaped pulse trains like 319, or parts of them, may be stored in memory 309 and may be selected and/or concatenated together in response to duty-cycle selecting bits 301*b*. Alternatively or additionally, a real-time convolution engine may be included in generator 308 for producing real time adaptive results that shift as internal characteristics of the driven plant shift and/or as external environmental parameters (e.g., temperature or load) shift.

As a result of the specially-modulated signal 319 provided on DAC input nodes 321*b*, the effective number of digital input bits for the illustrated DAC 322 will be up to (N−3)+M where each of N and M is an integer that greater than 3. For example, N could be 16 (the characteristic bit number of DAC 322) and M could be 7. This would allow a less expensive 16-bit DAC to appear as if it were a more expensive, 20-bit DAC in so far as the stepwise driven resolution of the driven plant 360 is concerned when the special-modulation technique is used.

Graph 330 shows DAC output level versus time. The major discrete levels, 341, 342, 343, 344 are commanded by MSB's 321*a* while the stair-case-like minor discrete levels in the specially-modulated waveform sections 319*a* and 319*b* are commanded by LSB's 321*b*. It is to be understood that the specially-modulated waveform sections 319*a* and 319*b* will cause the driven plant 360 to respond at levels in between those corresponding to major levels 341–344, where the in between responses are defined by the commanded duty cycles defined by the M bits on bus 301*b*. It is to be further understood that specially-modulated waveform sections 319*a* and 319*b* will typically be shaped to reduce or suppress vibrations that would otherwise be induced because the high frequency energy content of the drive signal 330 on line 326 extends into the resonant peak regions 354*a* and 354*b* of the plant's response versus frequency graph 350. The pulse shaping provided by generator 308 will cause drive energy in the pole frequency/phase regions of peaks 354*a* and 354*b* to interact destructively while drive energy centering about depression (trough) 355 and/or extending above $f_{cutoff}$ will be allowed to interact with itself constructively so that such constructively interacting energy, is converted into a DC response or substantially low frequency response when expressed by the plants output behavior. Despite the foregoing, in some instances it may be desirable to drive the plant 360 at or near its output poles for a short period of time (e.g., in order to get maximum output in minimum time), in which case the vibration suppressing attributes of the driving system (e.g., DAC 322 and generator 308) may be temporarily disabled.

Yet another approach in accordance with the invention is drive signal syncopation. Rather than using one specific drive signal (e.g., pulse train) for providing a given duty cycle, say a 50% duty cycle, a system can rapidly syncopate between two pulse-width-modulated trains that have effective duty cycles above and below the desired duty cycle, say between 48% and 52%; and/or that have different phasings. The alternation between the pulse width-modulated trains having lower and higher-than-desired duty cycles (and/or different phasings) may be used to avoid driving an undesirable resonant response and to nonetheless achieve resolution enhancement. The syncopated-between, lower and higher-than-desired duty cycle waveforms (and/or waveforms of different phase distributions) are selected because their excitation energies individually and/or collectively do not excite the plant's resonant poles as much (i.e. due to destructive phasings of resonant output behaviors). The inherent integrating effects of the driven plant can smooth out the differences between the syncopated drive signals (e.g., 48% and 52% duty cycles) to thereby provide the effects of the drive signal (e.g., 50%) that, had it been used, would have triggered a resonant response by the plant system.

Although in the given examples, the duty cycle modulated pulse trains or waveforms, 219 and 319, are shown to be applied to the least significant bit or bits (LSB) of the DAC, this is not necessary. Any one or more of the more significant input bit nodes of the DAC can be alternatively or additionally specially-modulated so that the integrating effects of the driven plant smooth out the narrowly-pulsed results and provide enhanced resolution. Of course, if the more significant input bits of the DAC are specially pulsed, the width of the special pulses should be narrowed in rough proportion to the increased magnitude of DAC-output associated with a toggling of that one or more, more significant input bits.

Aside from using the variable duty cycle technique for fine-positioning systems, it may also be used in photonic applications such as for controlling the angle of a laser beam steering mirror or otherwise controlling via a plural bit DAC, electro-optical active materials whose response time is slow in respect to the maximum drive frequency of the driving electronics.

Figure 4:
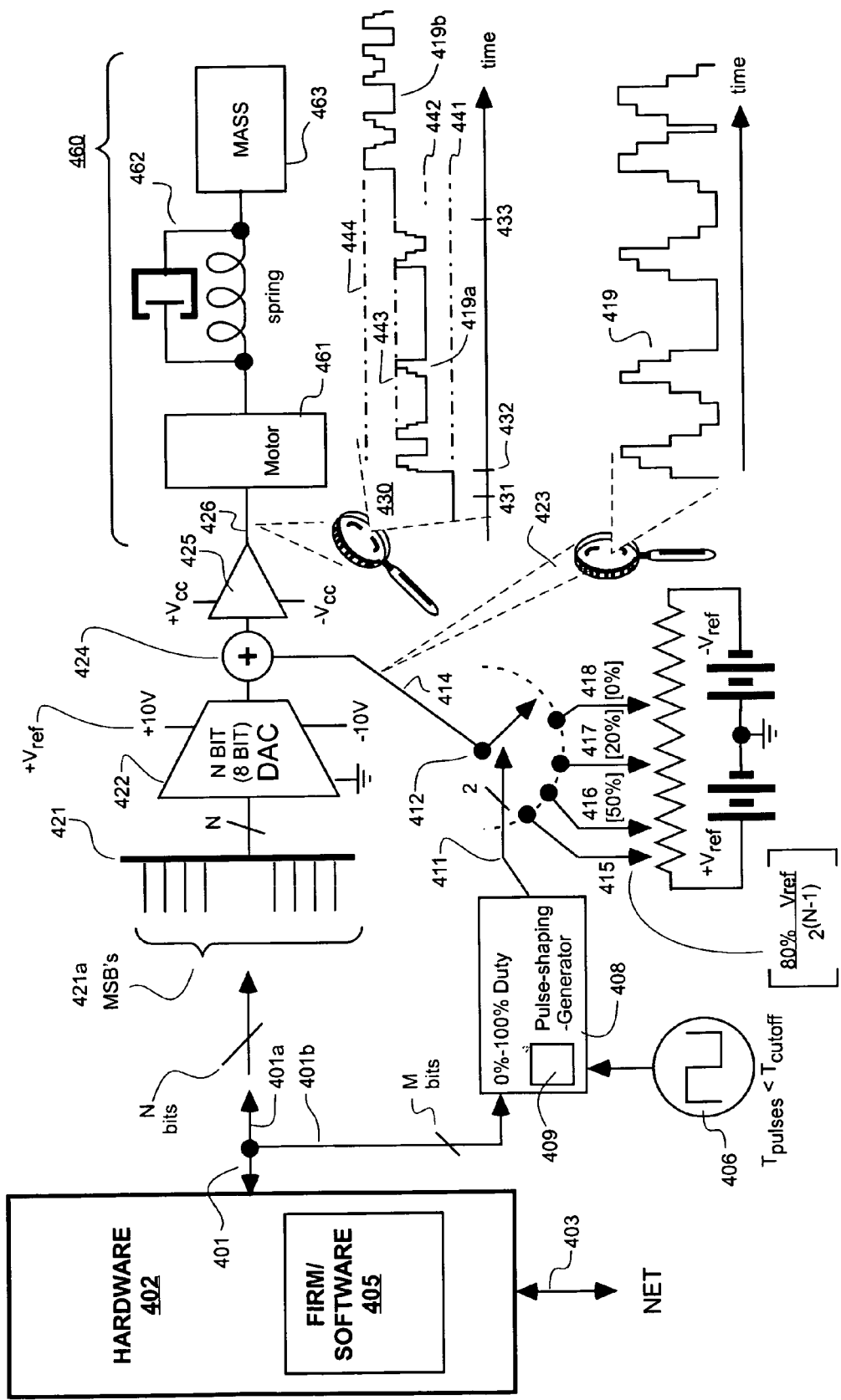
FIG. 4 is a schematic diagram showing another way of adding the resolution enhancing signal into the plant drive signal.

FIG. 4 is a schematic diagram showing another way 400 of adding a resolution enhancing signal 419 into a plant's drive signal, this time at the output side of the illustrated DAC 422. Reference numbers in the "400" century series are used in FIG. 4 where practical to refer to items having similarly-numbered counterparts in FIG. 3 under the "300" century series. Accordingly, a detailed description of most components is not needed. One important difference is that FIG. 4 shows all N (e.g., N=8) of the original N digital command bits being applied in normal fashion to the N input bit nodes 421 of the DAC 422. The resolution enhancing, M command bits are coupled to a pulse shaping generator 408. An output line 411 of the shaping generator 408 actuates an electronically actuated switch 412. An output line 414 of the switch 412 couples to a first input an analog adder 424 while a second input of the adder 424 receives an output signal from the N-bit DAC 422.

In the illustrated example 400, the output of the DAC 422 swings between a positive reference voltage level, $+V_{ref}$ set at +10V and a negative reference voltage level, $-V_{ref}$ set at −10V. The total swing of $+V_{ref}-(-V_{ref})=20V$ is divided into $2^N$ gradient steps by action of the DAC 422. Electronically actuated switch 412 has a plural number (e.g., four) of selectable states corresponding to the provision of selected addition or subtraction voltage amounts on output line 414 of the switch (an input to adder 424). By way of example, the illustrated selectable levels correspond to a 0V level (ground, 418) as one of the selectable amounts and to the establishment of an 80% value as another level (415), the establishment of a 50% level (416), and the establishment of a 20% level (417) on output line 414, where the percentage levels are those of $V_{ref}$ divided by $2^{(N-1)}$. {It is N−1 rather than N because the full swing of DAC 422 is 2 times $V_{ref}$.} Rather than using batteries and a potentiometer, as is schematically shown, a precision voltage divider may be formed by a variety of other known means to generate the desired fractional values of the DAC's output swing, $+V_{ref}-(-V_{ref})$. Moreover, the 0%, 20%, 50% and 80% values are merely examples. Other values (negative and/or positive) may be used and/or a greater number of such different percentage values may be used in various embodiments. As shown in waveform 419, the illustrated 0%, 20%, 50% and 80% values may be used to cause a shaped pulse to first go up to 50% of its full major step magnitude, and then another 30% up to the 80% mark. Then the 0% value may be used in combination with a major step driven by DAC 422 to reach the 100% level. Afterwards, on the down swing, the 50% value is again used to go down 50% of the way. Next the 20% value (20%=100%−80%) is used to go down a further 30% of the way. Finally the 0% value is used to reach the bottom of the major-step swing. Switch 412 can be driven by as few as 2 bits on control line 411 to provide the complex waveshaping shown at 419.

In one embodiment, the electronically actuated switch 412 has a maximum switching rate that is substantially greater than the maximum switching rate (or update rate) of its corresponding DAC 422. The associated cost of a DAC tends to go up with its rated, maximum switching rate. However, in the illustrated embodiment 400, DAC 422 does not need to have a very high, maximum update rate (although it could have one nonetheless). It is only the post-DAC, special-modulating signal 419 (on switch output line 414) that has to have a sufficiently high update rate to be able to get above the predefined cutoff frequency, $f_{cutoff}$ of the driven pant 460. Thus a DAC of reduced update rate may be used in schematic position 422, thereby reducing system cost and/or allowing other analog channels (not shown) to have a greater share of the finite update bandwidth on system bus 401 and/or to have a greater share of the finite multi-tasking bandwidth provided in execution of system software 405. As indicated for the embodiments of FIGS. 2–3, the pulse shaping generator may be implemented as software inside portion 405 rather than as dedicated hardware. Predefined waveform defining sequences may be stored in a ROM and/or RAM unit 409 for driving switch 412 in accordance with the M command bits provided on line 401b. The waveforms-defining memory unit 409 can be defined as a hardware part of the driving switch 412 so that once the M bits of line 401b select a given waveform or duty cycle, the driving switch 412 operates on a substantially autonomous basis to produce the desired, specially-modulated waveform 419, thereby freeing the system software 405 to perform other multitasked duties. (As indicated above, however, for certain configurations there may be times when the DAC 422 has to be updated in combination with switch 412 to provide a desired modulation magnitude.)

Figure 5:
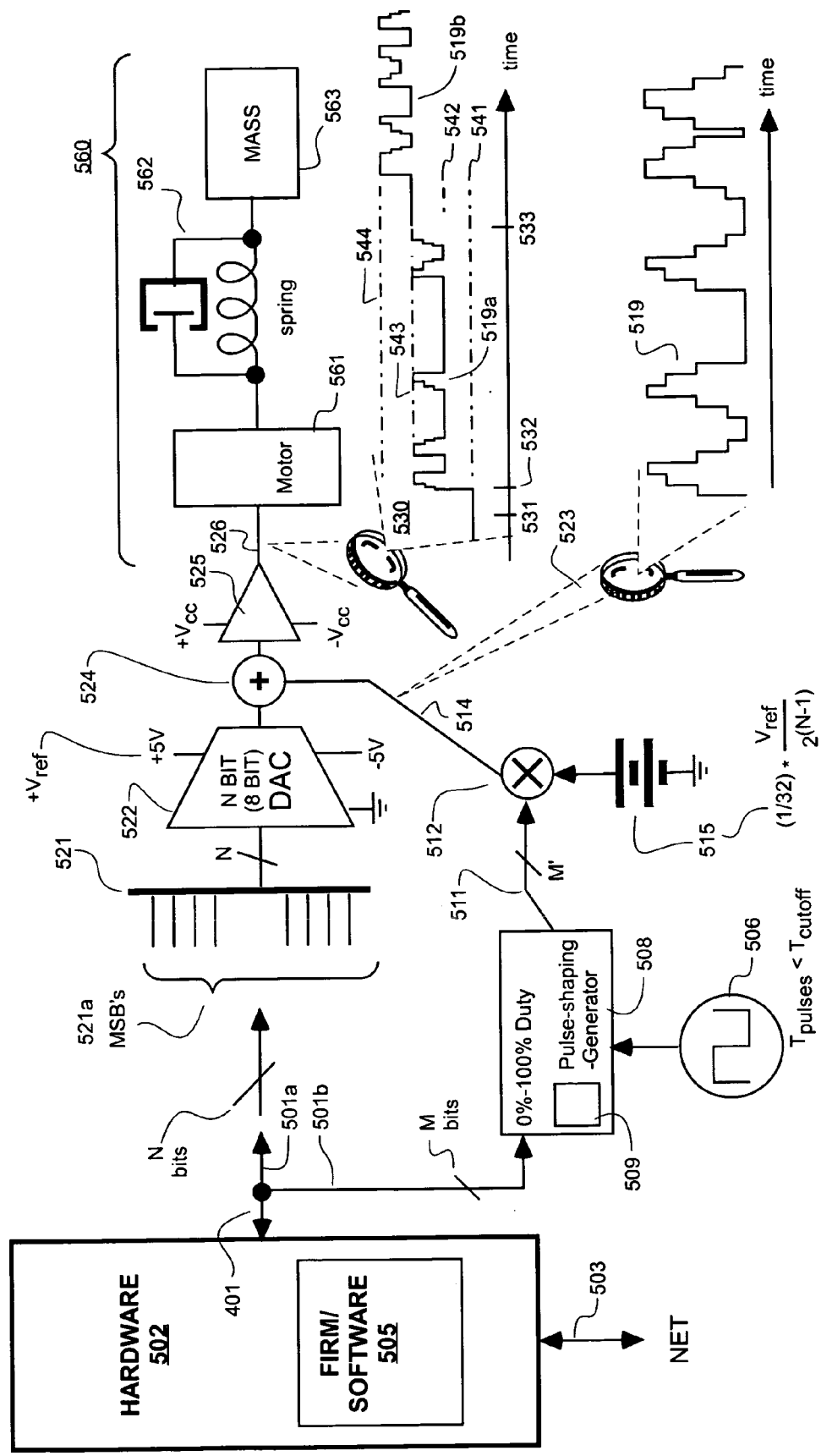
FIG. 5 is a schematic diagram showing yet another way of adding the resolution enhancing signal into the plant drive signal.

FIG. 5 is a schematic diagram showing yet another way 500 of adding a resolution enhancing signal 519 into a plant's drive signal, again at the output side of the illustrated DAC 522. Reference numbers in the "500" century series are used in FIG. 4 where practical to refer to items having similarly-numbered counterparts in FIG. 4 under the "400" century series. Accordingly, a detailed description of most components is not needed. Multiplier 512 receives an analog reference signal from reference source 515 and a digital command sequence 511 (M' bits wide) from pulse shaping generator 508. The analog reference source 515 may be set at a predefined fractional multiple of major step value, $V_{ref}/2^{(N-1)}$. By way of example, it could be 1/32 or 1/64 of $V_{ref}/2^{(N-1)}$. The digital multiplier value on bus 511 can have the range 0 to 31 (or to 63) thereby providing a full range of ministeps with which to shape the output signal on line 514. Adder 524 adds the multiplied reference value to the DAC output to thereby provide a modulated signal. The signal on line 511 may be signed or unsigned. In the signed version, multiplier 512 outputs negative voltages as well as positive ones.

In yet another variation (not shown), the DAC has a built-in multiplier for providing signal modulation. Such a built-in multiplier can be exploited to provide the special-modulation described herein. One of the multiplicands would be equal to 1 plus a small fractional value representing the added, special-modulation (e.g., $1+1/(2^Z)$, where Z>N) while another multiplicand represents the characteristic DAC output. Such a scheme would generally be complicated however by the need to adjust the fractional value to counter-compensate for the magnitude of the characteristic DAC output.

In yet another variation (not shown), the DAC has a built-in additive input which may be identified as an offset input or reference voltage input. If the DAC does not have a front-end low-pass filtering mechanism permanently embedded with such an offset input or reference voltage input, then the special-modulating signal may be injected into the DAC analog output signal by way of such a front-end mechanism. On the other hand, if a front-end low-pass filtering mechanism is permanently present to block the effects of the high frequency modulations from getting through to the driven plant, then applying the special-modulating signal to such a front-end mechanism may not provide the desired results.

Figure 6:
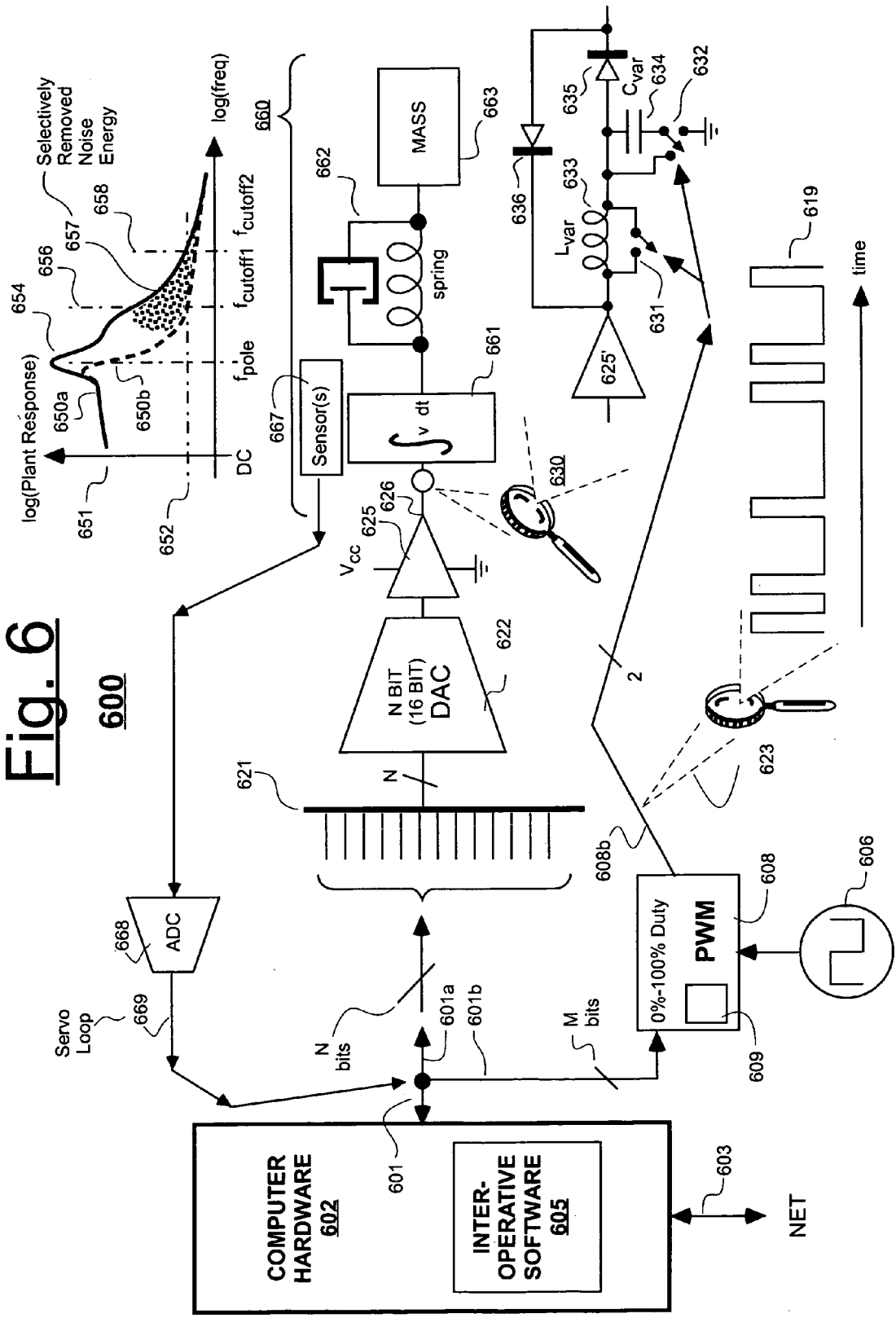
FIG. 6 is a schematic diagram showing a method of specially modulating the amount of high frequency noise or other energy passed unipolar-wise to an above-cutoff spectral region of the driven plant to thereby increase the apparent resolution of the DAC.

An aspect common to the embodiments of FIGS. 2–5 is that effectively uni-polar and high frequency, pulsatile energy is intentionally injected in one manner or another into the analog drive path of the driven plant such that the injected energy concentrates itself, frequency-wise above a predefined cutoff frequency ($f_{cutoff}$) of the plant and/or near an anti-pole frequency ($f_{zero}$) of the plant so that the plant will sluggishly respond in a non-pulsatile way to the effective duty cycle of the intentionally injected, pulsatile energy. Referring to FIG. 6, it is sometimes the case that a significant amount of high frequency energy is already present in the analog drive path 626 between the DAC's output amplifier 625 and the driven plant, where that high frequency energy is in the form of amplifier generated noise or in another symmetrically and predominantly bipolar-wise oscillating energy form (e.g., high frequency parasitic and usually permanently suppressed oscillations of the amplifier). If either the positive magnitude half or the negative magnitude half of this high frequency energy is selectively filtered in an asymmetric manner, then a similar resolution enhancing effect may be obtained as was with the intentionally injected, uni-polar and high frequency, pulsatile energy of the embodiments of FIGS. 2–5 except that the magnitude of the injected energy may not be as easily controlled.

FIG. 6 is a schematic diagram showing a method 600 of specially modulating the amount of high frequency noise or other oscillating energy so it is passed unipolar-wise to an above-cutoff spectral region of the driven plant to thereby increase the apparent resolution of the DAC. Reference numbers in the "600" century series are used in FIG. 6 where practical to refer to items having similarly-numbered counterparts in FIG. 2 under the "200" century series. Accordingly, a detailed description of most components is not needed. A major difference in FIG. 6 is that an asymmetrical and digitally-controlled filtering means 630 is interposed between amplifier output 626 and the driven plant 660. As seen in the magnified view, filtering means 630 treats positive magnitude signal flows differently from negative magnitude ones due to the presence of diodes 635 and 636. Other forms of separation of the positive and negative signal flows may be employed. This is just an illustrative example. A selectively-actuated, low pass filter is formed by one or both of inductor 633 and capacitor 634. The inductor 633 and/or capacitor 634 may be of the variable inductance/capacitance type rather than being completely switched in or out of the circuit as indicated by digitally-controlled switches 631 and 632. A 2-bit control signal 608b is routed to control switches 631 and 632 as shown. (If inductor 633 and/or capacitor 634 were instead of a more variable inductance/capacitance type, then the control signal 608b may have additional bits for selecting the desired inductance and/or capacitance as appropriate.) When switch 631 shorts out inductor 633 and switch 632 shorts out capacitor 634, then positive and negative portions of the passing through, signal flow are treated the same. However, if switch 631 is opened to place inductor 633 in series with diode 635 and/or if switch 632 is actuated to place capacitor 634 between diode 635 and ground, then the unipolar energy that flows through diode 635 will be treated differently than the oppositely, unipolar energy that flows through diode 636. The high-frequency energy content will be selectively cut-out or cut-in for one of the unipolar energy flows but not the other as switches 631 and 632 are controllably opened and closed under the command of control signal 608b. The driven plant will respond sluggishly to the cutting-out or cutting in of this unipolar, high frequency energy content. This is schematically represented at 657 in the illustrated frequency response curve. (Digitally controlled filter 630 may be viewed as shifting the effective cutoff back and forth between $f_{cutoff1}$ and $f_{cutoff2}$ for one of the unipolar energy flows.) Accordingly, when control signal 608b is appropriately turned on and off by a control waveform such as 619 (as selected by the M bits on line 601b), the driven plant will appear to step to a graduation level of finer resolution than conventionally possible with the N input bits of DAC 622. Note that in this embodiment 600, DAC 622 receives all N input bits at its input port 621 directly from control bus 601a. It is within the contemplation of the disclosure however to combine the variable filtering technique of FIG. 6 with one or more of the other unipolar signal adding or subtracting techniques of FIGS. 2–5 in order to obtain a desired level of resolution enhancement.

The present disclosure is to be taken as illustrative rather than as limiting the scope, nature, or spirit of the subject matter claimed below. Numerous modifications and variations will become apparent to those skilled in the art after studying the disclosure, including use of equivalent functional and/or structural substitutes for elements described herein, use of equivalent functional couplings for couplings described herein, and/or use of equivalent functional steps for steps described herein. Such insubstantial variations are to be considered within the scope of what is contemplated here. Moreover, if plural examples are given for specific means, or steps, and extrapolation between and/or beyond such given examples is obvious in view of the present disclosure, then the disclosure is to be deemed as effectively disclosing and thus covering at least such extrapolations.

It is understood that the invention contemplates the programmable configuring of a programmable device (e.g., computer 102 of FIG. 1) to carry out the generation of the specially-pulsed pulse trains 219, 319, 419 or 519. A computer-readable medium or another form of a software product or machine-instructing means (including but not limited to, a hard disk, a compact disk, a flash memory stick, a downloading of manufactured instructing signals over a network (e.g., 103) and/or like software products) may be used for storing definitions of the special-modulating signals (219, 319, 419 or 519) and/or for storing definitions of algorithms for producing the special-modulating signals. The machine-instructing means may be used for instructing an instructable machine (e.g., 102/105) to carry out such special-modulation activities in accordance with the present disclosure. As such, it is within the scope of the disclosure to have an instructable machine and to provide a software product 205 adapted for causing the instructable machine to carry out a machine-implemented method that includes generation of the above described special-modulating waveforms 219, 319, 419 or 519 or precursors thereof.

It is understood that the invention also contemplates completely hardwired or firmware-wise programmed implementations. For example, an analog/digital I/O channel (e.g., 120 of FIG. 1) may have a 20-bit ADC (123) whose output couples to an on-card, programmable or non-programmable digital processing module (DSP 108—shown in phantom). The 20-bit ADC (123) inputs an analog feedback signal (124) from its plant (162) and converts it to a 20-bit digital representation. The 20-bit digital representation is processed by the on-card, digital processing module (DSP 108) to thereby produce a digitally filtered command signal (or an otherwise digitally generated, command signal) having 20-bits of valid information. The 20-bit command (not shown) is then immediately returned via an on-card DAC such as 122 to drive the plant (162), where the on-card DAC (122) has a smaller number of characteristic input bits (e.g., 16 input bits) than required by the 20-bit command. However, one of the resolution enhancing techniques of the invention is used to raise the apparent resolution of the 16-bit DAC (122) to effectively that of a 20-bit DAC. For example the on-card DSP module (108) pre-converts the 20-bit command signal (not shown) into a 13-bit direct drive for the 13 MSB input bit nodes of the DAC (122), and in accordance with FIG. 3, produces another group of 3 pulse-shaping bits 321b to generate corresponding, input-shaped drive signals at the output of the DAC, such as the illustrated 319a and 319b pulse trains of graph 330. In this way, the on-card DSP capabilities 108 of the DAC card 150, if any, can be used to produce specially-pulsed drive trains without need for a host computer (e.g., 102). Of course, the host computer (e.g., 102) can nonetheless be used to re-program the on-card DSP module (108, if a reprogrammable type) when deemed appropriate and/or to monitor the behavior of the on-card DSP module 108.

Reservation of Extra-Patent Rights, Resolution of Conflicts, and Interpretation of Terms After this disclosure is lawfully published, the owner of the present patent application has no objection to the reproduction by others of textual and graphic materials contained herein provided such reproduction is for the limited purpose of understanding the present disclosure of invention and of thereby promoting the useful arts and sciences. The owner does not however disclaim any other rights that may be lawfully associated with the disclosed materials, including but not limited to, copyrights in any computer program listings or art works or other works provided herein, and to trademark or trade dress rights that may be associated with coined terms or art works provided herein and to other otherwise-protectable subject matter included herein or otherwise derivable herefrom.

If any disclosures are incorporated herein by reference and such incorporated disclosures conflict in part or whole with the present disclosure, then to the extent of conflict, and/or broader disclosure, and/or broader definition of terms, the present disclosure controls. If such incorporated disclosures conflict in part or whole with one another, then to the extent of conflict, the later-dated disclosure controls.

Unless expressly stated otherwise herein, ordinary terms have their corresponding ordinary meanings within the respective contexts of their presentations, and ordinary terms of art have their corresponding regular meanings within the relevant technical arts and within the respective contexts of their presentations herein.

Given the above disclosure of general concepts and specific embodiments, the scope of protection sought is to be defined by the claims appended hereto. The issued claims are not to be taken as limiting Applicant's right to claim disclosed, but not yet literally claimed subject matter by way of one or more further applications including those filed pursuant to 35 U.S.C. §120 and/or 35 U.S.C. §251.

What is claimed is:

1. A plant driving system which receives one or more digital drive command signals and outputs corresponding analog output signals for driving at least a corresponding first analog plant to corresponding states, the driving system comprising:
   (a) a first digital-to-analog converter (DAC) having a first input port receiving a first plural number, N of effective input bits, a first analog output port that produces a first analog output signal having major discrete magnitudes corresponding to the effective input bits of the first input port, said first DAC having a respective, first characteristic output resolution corresponding to the first plural number, N of effective input bits; and
   (b) first modulating means for causing one or more special-modulating signals to be injected onto the major discrete magnitudes of the first analog output signal, said special-modulating signals being adapted to invoke respective sluggish behaviors of the corresponding first analog plant and said special-modulating signals having effective magnitudes and/or effective duty cycles for causing the first analog plant to be driven to corresponding steady states between major steady states of the first analog plant, where said major steady states respectively correspond to the major discrete magnitudes of the first analog output signal.

2. The driving system of claim 1 wherein:
   (b.1) said first modulating means includes front-end modulating means for modulating at least one of the input bits of the first DAC with at least one of said special-modulating signals.

3. The driving system of claim 1 wherein:
   (b.1) said first modulating means includes back-end modulating means for modulating said major discrete magnitudes of the first analog output signal at a back-end portion of the first DAC to thereby inject at least one of said special-modulating signals onto the major discrete magnitudes of the first analog output signal.

4. The driving system of claim 1 wherein:
   said first one or more special-modulating signals are structured to command the first plant to operate in a frequency and/or phase domain to which the first plant has sluggish response;
   wherein the corresponding first analog plant that is to be driven by the first analog output node has at least one smoothing function which smoothes higher frequency energy content of the first analog output signal resulting from the injection of the first one or more special-modulating signals so that variation of the effective duty cycle and/or variation of the effective magnitude of the first one or more special-modulating signals operates as a fine resolution modifier for increasing an apparent output resolution of the first DAC above the characteristic output resolution associated with the DAC's first plural number, N of input bits.

5. The driving system of claim 1 wherein:
   (a.1) said first plural number, N is 3 or greater.

6. The driving system of claim 1 wherein:
   (a.1) said first DAC has a maximum, output updating rate substantially greater than a predefined cutoff frequency of the corresponding first analog plant.

7. The driving system of claim 1 wherein:
   (a.1) said first DAC has a maximum, output updating rate substantially greater than 500 Hz.

8. The driving system of claim 1 wherein:
   (a.1) said first DAC is a loop-internal part of a calibrated or calibratable servo loop.

9. The driving system of claim 1 wherein:
   (a.1) said first DAC is part of a programmable voltage source that generates a digitally-commanded voltage level.

10. The driving system of claim 1 and further including computer hardware programmed with corresponding software where said software implements at least part of said first modulating means.

11. The plant driving system of claim 1 wherein the plant driving system is part of a larger digital/analog system having additional DACs and additional analog plants.

12. The driving system of claim 11 wherein:
(a.2) said additional DACs include a second DAC having a corresponding second input port with a second plural number, N' of digital input bits, a second analog output port that produces a second analog output signal corresponding to digital sates of the N' input bits of the second input port, and a second basic output resolution corresponding to the second plural number, N' of digital input bits, said second analog output port being operatively coupled to a second analog plant; and wherein the system further includes
(c) second modulating means for causing one or more second special-modulating signals to be injected onto the major discrete magnitudes of the second analog output signal, said second special-modulating signals being adapted to invoke respective sluggish behaviors of the corresponding second analog plant and said second special-modulating signals having effective magnitudes and/or effective duty cycles for causing the second analog plant to be driven to corresponding second steady states between major steady states of the second analog plant, where said major steady states of the second analog plant respectively correspond to the major discrete magnitudes of the second analog output signal.

13. The driving system of claim 12 and further including computer hardware programmed with corresponding software where said software implements at least part of at least one of said first and second modulating means.

14. The driving system of claim 12 wherein:
(a.3) said larger digital/analog system includes a digital I/O interface that receives serialized drive commands for at least said first and second DACs and routes corresponding, channel drive commands respectively to the first and second DACs as digital input words, the serialized drive commands including commands for defining and/or activating said first and second special-modulating signals.

15. The driving system of claim 1 wherein:
(b.1) the first modulating means includes programmable waveform defining means for programmably defining waveforms of respective special-modulating signals that will each have correspondingly different, effective duty cycles and/or correspondingly different, effective magnitudes.

16. The driving system of claim 1 wherein:
(b.1) the first modulating means is responsive to a supplied digital control signal which digital control signal defines effective duty cycles to be implemented by the first special-modulating signals output by the first modulating means.

17. The driving system of claim 1 and further comprising:
(c) a fine positioning subsystem operatively coupled to the first analog output node as said corresponding first analog plant.

18. The driving system of claim 17 wherein said fine positioning subsystem includes a positioning actuator selected from the group consisting of:
(c.1) a piezoelectric actuator;
(c.2) a magnetostrictive actuator;
(c.3) an electrostatic actuator;
(c.4) an electrostrictive actuator;
(c.5) a thermally-driven actuator; and
(c.6) a magnetic voice coil actuator.

19. The driving system of claim 1 and further comprising:
(c) a spring-mass subsystem operatively coupled to the first analog output node as at least part of said corresponding first analog plant.

20. The driving system of claim 1 and further comprising:
(c) an electronic, over-time integrator operatively coupled to the first analog output node and thereby defining at least part of said corresponding first analog plant.

21. A method of driving an analog plant with digital control signals, the method comprising:
(a) providing a first digital-to-analog converter (DAC) having a first input port with a corresponding first plural number, N of digital input bits, a first analog output node that produces a corresponding first analog output signal corresponding to digital states of the first plural number, N of digital input bits, and a characteristic output resolution corresponding to the first plural number, N of digital input bits;
(b) causing one or more special-modulating signals to be injected onto the major discrete magnitudes of the first analog output signal, said special-modulating signals being adapted to invoke respective sluggish behaviors of the corresponding first analog plant and said special-modulating signals having effective magnitudes and/or effective duty cycles for causing the first analog plant to be driven to corresponding steady states between major steady states of the first analog plant, where said major steady states respectively correspond to the major discrete magnitudes of the first analog output signal; and
(c) varying said effective magnitudes and/or effective duty cycles of the special-modulating signals so that a driven plant coupled to the DAC analog output node operates sluggishly in response to the varied effective magnitudes and/or effective duty cycles of the special-modulating signals such that the variable effective duty cycles and/or effective magnitudes function as a fine resolution modifiers for increasing an apparent output resolution of the first DAC and first analog plant above the characteristic output resolution of the first DAC.

22. The method of claim 21 and further including:
(d) programmably defining a plurality of waveforms that are to respectively serve as said special-modulating signals.

23. The method of claim 21 wherein said step (c) of varying the effective magnitudes and/or effective duty cycles of the special-modulating signals is carried out by a computer having software defining the effective magnitudes and/or effective duty cycles of the special-modulating signals.

24. A method for increasing an apparent resolution of one or more DAC-driven plants, where a given first digital-to-analog converter (DAC) driving a corresponding first given plant has a first plural number, N of operative digital input bit nodes, a first analog output node that produces a first analog output signal having major discrete magnitudes corresponding to digital input words applied to the operative digital input bit nodes of the first DAC, said first DAC having a respective, first characteristic output resolution corresponding to the first plural number, N of operative digital input bit nodes; and others of DAC-driven plants if any having their resolutions being enhanced having corresponding other DACs with same or different numbers of corresponding operative digital input bit nodes; said resolution increasing method comprising:
(a) generating a plurality of special-modulating signals; and (b) causing at least one of the generated special-modulating signals to be injected onto the major discrete magnitudes of the first analog output signal, different ones of said injected special-modulating signals being adapted to invoke different respective sluggish behaviors of the corresponding first analog plant and different ones of said special-modulating signals having effective magnitudes and/or effective duty cycles for causing the first analog plant to be driven to corresponding steady states between major steady states of the first analog plant, where said major steady states respectively correspond to the major discrete magnitudes of the first analog output signal.

25. The resolution increasing method of claim 24 wherein:
(a.1) said generating of one or more of the special-modulating signals includes applying one or more vibration suppression techniques which prevent or reduce vibrations in the first driven plant when driven directly or indirectly by a combination of said major discrete magnitudes of the first analog output signal and the corresponding special-modulating signals to which the one or more vibration suppression techniques have been applied.

26. The resolution increasing method of claim 25 wherein:
(a.1a) said one or more vibration suppression techniques includes Input Shaping.

27. The resolution increasing method of claim 25 wherein:
(a.1a) said one or more vibration suppression techniques includes syncopating between two or more, different special-modulating signals in order to realize a blended plant response between responses associated with the different special-modulating signals that are being syncopated between.

28. The resolution increasing method of claim 24 wherein:
(b.1) said causing of at least one of the generated special-modulating signals to be injected includes applying at least one of the generated special-modulating signals to one of the operative digital input bit nodes of the first DAC.

29. The resolution increasing method of claim 24 wherein:
(b.1) said causing of at least one of the generated special-modulating signals to be injected includes adding at least one of the generated special-modulating signals to the first analog output signal of the first DAC.

30. The resolution increasing method of claim 24 wherein:
(b.1) said causing of at least one of the generated special-modulating signals to be injected includes multiplying at least one of the generated special-modulating signals against a reference signal that corresponds to a same or related reference signal used by the first DAC.

31. The resolution increasing method of claim 24 wherein:
(a.1) said generating of one or more of the special-modulating signals includes switching between predefined fractions of a reference signal that corresponds to a same or related reference signal used by the first DAC.

32. A method for controlling a DAC-driven, analog plant where the analog plant is characterized by at least one of an above-cutoff spectral region and an anti-pole spectral region, the method comprising:
(a) causing predominantly unipolar energy occupying least one of said above-cutoff spectral region and said anti-pole spectral region to be selectively injected into or not injected into the analog plant; and
(b) selectively controlling the amount of said unipolar energy that is selectively injected into or not injected into the analog plant so as to bring the plant to a steady state between major discrete steady states commandable by steady state command bits applied to the plant-driving DAC.

33. The method of claim 32 wherein:
(a.1) said causing includes asymmetrically and selectively filtering positive and negative flowing portions of high frequency energy passing on an operative connection between the DAC and the analog plant.

* * * * *